(12) United States Patent
Terasaki

(10) Patent No.: US 6,388,919 B2
(45) Date of Patent: May 14, 2002

(54) MEMORY CONTROLLER FOR FLASH MEMORY SYSTEM AND METHOD FOR WRITING DATA TO FLASH MEMORY DEVICE

(75) Inventor: Yukio Terasaki, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/741,228

(22) Filed: Dec. 19, 2000

(30) Foreign Application Priority Data

Dec. 20, 1999 (JP) ............................................. 11-360394
Oct. 2, 2000 (JP) ........................................ 2000-301657

(51) Int. Cl.[7] ............................................... G11C 16/06
(52) U.S. Cl. ............................. 365/185.09; 365/185.33; 365/185.22
(58) Field of Search ....................... 365/185.09, 185.33, 365/185.22

(56) References Cited

U.S. PATENT DOCUMENTS

| | | | |
|---|---|---|---|
| 5,388,083 A | * | 2/1995 | Assar et al. ............ 365/185.09 |
| 5,663,901 A | | 9/1997 | Wallace et al. |
| 5,841,699 A | * | 11/1998 | Miyauchi ............... 365/185.33 |
| 5,862,080 A | | 1/1999 | Harari et al. |
| 5,867,417 A | | 2/1999 | Wallace et al. |
| 5,978,808 A | | 11/1999 | Wells et al. |

* cited by examiner

*Primary Examiner*—Huan Hoang
(74) *Attorney, Agent, or Firm*—Brown Raysman Millstein Felder & Steiner, LLP

(57) ABSTRACT

A memory controller which performs a verification of the state of the erased block is performed prior to the writing operation is disclosed. The memory controller according to said present invention further performs a test operation to judge whether the erased block is a defective block to be disposed or not if the erased block is concluded to be not prefer to store data during the verification. In the case where the block is concluded to be a defective block with a permanent error by the test operation, the block is inhibited to use. In the case where the block is concluded to be a defective block with a transient error by the test operation, on the other hand, the block is treated as new erased block.

25 Claims, 11 Drawing Sheets

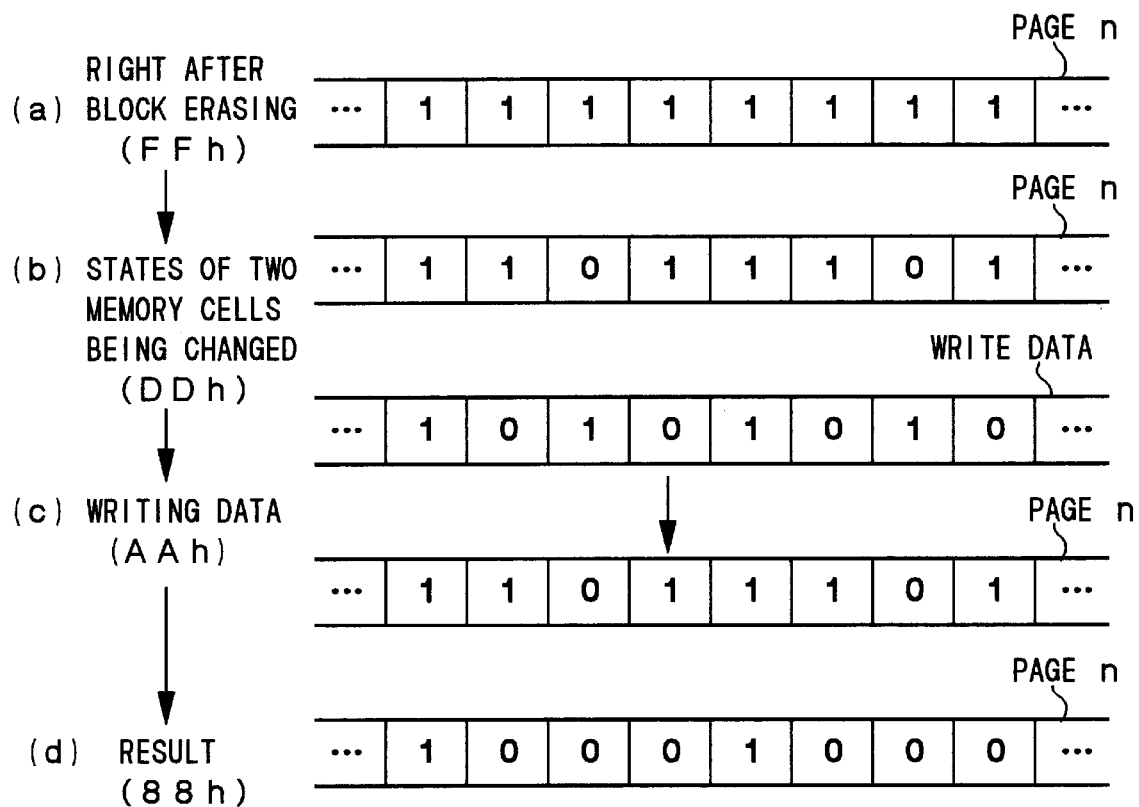

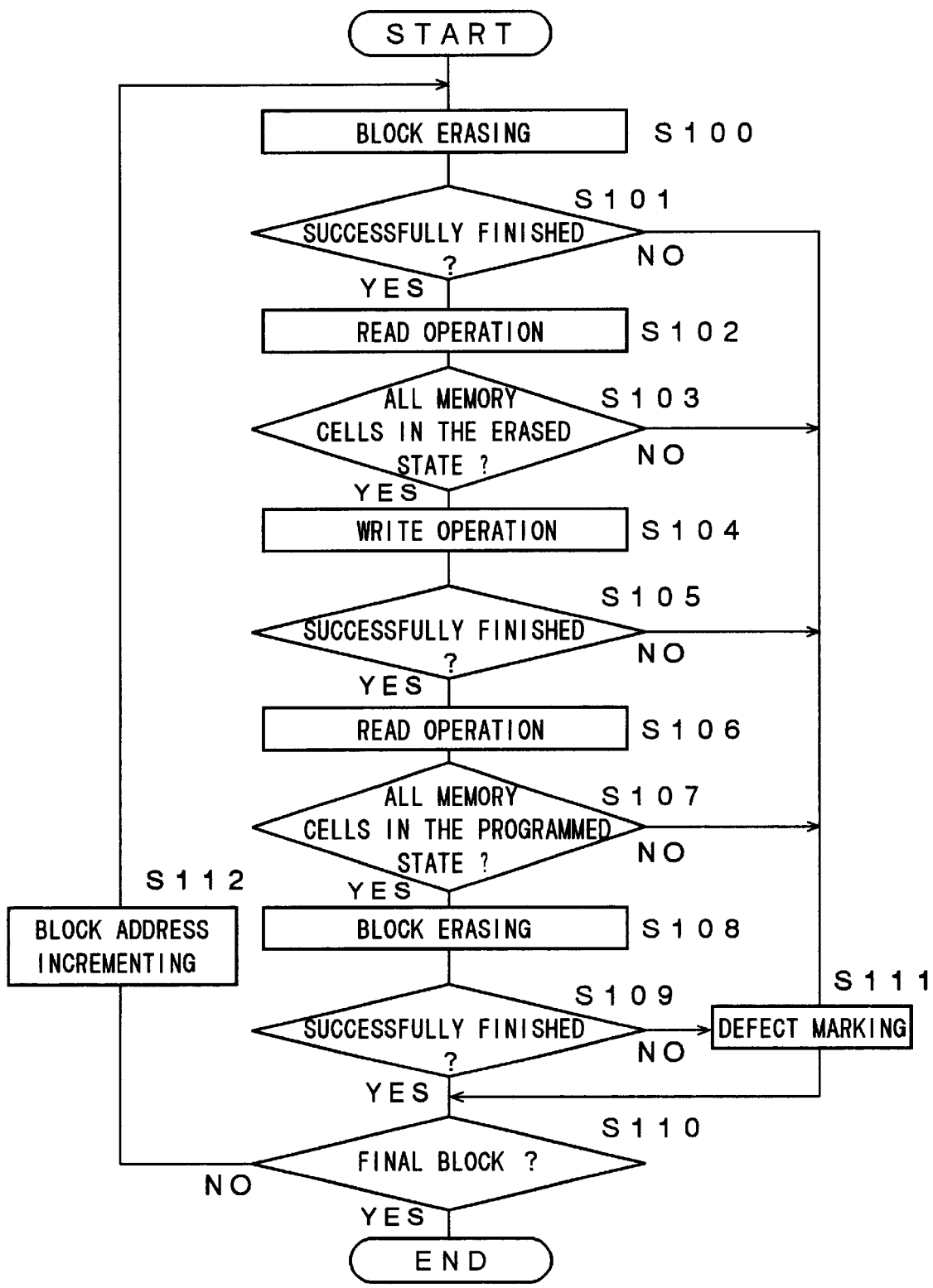
F I G. 1 2

MEMORY CONTROLLER FOR FLASH MEMORY SYSTEM AND METHOD FOR WRITING DATA TO FLASH MEMORY DEVICE

BACKGROUND OF THE INVENTION

The present invention relates to a memory controller for a flash memory system, a flash memory system and a method for writing data to a flash memory device, and particularly, to such a memory controller and a flash memory system that can write data to a flash memory device accurately and a method for writing data to a flash memory device accurately.

DESCRIPTION OF THE PRIOR ART

In recent years, flash memory devices, particularly NAND type flash memory devices, are widely used as semiconductor memory devices for memory cards, silicon disks and the like. In such a NAND type flash memory device, although a transition from an erased state (logical value="1") to a programmed state (logical value="0") can be performed for each memory cell as an individual unit, a transition from the programmed state (0) to the erased state (1) cannot be performed for each memory cell as an individual unit. Such a transition from the programmed state (0) to the erased state (1) can be only performed for a predetermined number of memory cells as a unit, called a "block", constituted of a plurality of memory cells. Such an operation is called "block erasing".

According to the NAND type flash memory device, because the transition from the programmed state (0) to the erased state (1) cannot be performed for each memory cell as an individual unit, in order to write data into a certain block, it is required to perform a block erasing operation to change the states of all memory cells included in the block to the erased state (1). A block-erased block becomes a free block in which no data are stored. In order to write new data into a flash memory device, search is made for such a free block and the new data are written into a found free block.

Because the flash memory device is a type of non-volatile memory device, the states of the memory cells of the flash memory device are maintained for a very long time regardless of whether power voltage is applied. Therefore, the data stored in the memory cells and the state of a free block of the flash memory device are reliably maintained after power voltage is cut off.

However, when reading or writing is performed with respect to a certain memory cell, gradual change may occur in the state of other memory cells connected to the same bit line as the certain memory cell owing to the "disturb phenomenon". It is known that incidence of the disturb phenomenon increases when the reading or writing operation is repeated. If the state of a memory cell is changed by the disturb phenomenon, not only are stored data corrupted but writing operation is also not successfully performed.

FIGS. 1(a) to 1(d) are schematic diagrams for explaining how writing operation is not successfully performed owing to the disturb phenomenon.

FIG. 1(a) shows the logical values of each of the memory cells constituting a page n right after block erasing. The page n is constituted of 8 memory cells and can store 256 ($2^8$) bits of data. As shown in FIG. 1(a), all memory cells constituting the page n are in erased state (logical value of "1") right after block erasing. In the case where the logical values of all memory cells constituting the page n are "1", data stored in the page n is FFh.

FIG. 1(b) shows the logical values of each of the memory cell constituting the page n in the case where the states of two memory cells thereof were changed from the erased state (1) to the programmed state (0) owing to the disturb phenomenon. Because the states of two memory cells have spontaneously changed to the programmed state (0), the data stored in the page n is changed to DDh as shown in FIG. 1(b).

FIG. 1(c) shows logical values of data (AAh) to be written in page n and the logical values of each of the memory cells constituting page n. To write the data (AAh) to page n, such an operation is performed that change the states of the memory cells corresponding to the bits whose logical value is "0" in the write data (AAh) from the erased state to the programmed state. No operation is performed on the memory cells corresponding to the bits whose logical value is "1" in the write data (AAh). Note that the data stored in page n was changed form FFh to DDh owing to the disturb phenomenon before writing of the data (AAh) thereto.

FIG. 1(d) shows the logical values of each of the memory cell constituting page n after the data (AAh) have been written. Because the writing operation is performed such that, on the one hand, the states of the memory cells corresponding to the bits whose logical value is "0" in the write data (AAh) are changed from the erased state to the programmed state and, on the other hand, the states of the memory cells corresponding to the bits whose logical value is "1" in the write data (AAh) are not changed, as mentioned above, the states of the two memory cells whose states were changed by the disturb phenomenon are maintained in the programmed state. As a result, the data stored in page n is not AAh but 88h. That is, incorrect data is stored.

As is apparent from the foregoing, the writing operation is not successfully performed if the states of the memory cells are changed owing to the disturb phenomenon.

If the power voltage is suddenly cut off during block erasing, it is possible that the memory cells in the block may not be sufficiently erased. Although this is not caused by the disturb phenomenon, in this case too, the writing operation is not successfully performed for the same reason as explained above.

SUMMARY OF THE INVENTION

It is therefore an object of the present invention to provide a memory controller which can write data correctly to flash memory devices.

Another object of the present invention is to provide a flash memory system which employs a memory controller which can write data correctly to flash memory devices.

A further object of the present invention is to provide a method for writing data correctly to flash memory devices.

The above and other objects of the present invention can be accomplished by a memory controller for accessing a flash memory device, comprising: search means for finding an erased block in said flash memory device in response to a data writing request from a host computer, verify means for verifying a state of said erased block found by said search means, and store means for storing data into said erased block which has been verified by said verify means.

According to this aspect of the present invention, improper data cannot be stored so that the quality of the data writing can be improved because verification of the state of the erased block in which data are to be stored is performed prior to data writing thereto.

In a preferred aspect of the present invention, the verify means verifies whether or not all flash memory cells constituting the erased block found by the search means are in an erased state.

In a further preferred aspect of the present invention, the memory controller further comprises test means, responsive to detection by said verify means of flash memory cell in a different state from said erased state, for testing whether or not said erased block is a defective block with a permanent error.

According to this preferred aspect of the present invention, in the case where a flash memory cell whose state is different from the erased state is detected, it is judged whether the block should be excluded. Therefore, exclusion of a defective block having a transient error can be avoided.

In a further preferred aspect of the present invention, the test means performs writing and first reading operations to store and read first test data to/from all flash memory cells constituting said erased block.

In a further preferred aspect of the present invention, the test means further performs erasing and second reading operations to store and read second test data to/from all flash memory cells constituting said erased block.

The above and other objects of the present invention can be also accomplished by a flash memory system, comprising: at least one flash memory chip divided into a plurality of blocks each of which includes a plurality of flash memory cells and a controller for controlling the flash memory chip, said controller including search means for finding from among said plurality of blocks an erased block in which all flash memory cells are in an erased state, store means for storing data into said erased block found by said search means, and verify means for verifying a state of said erased block found by said search means before said data are stored by said store means.

According to this aspect of the present invention, verification of the states of the erased block in which data are to be stored is performed prior to data writing thereto. Therefore, since improper data cannot be stored, the quality of data writing is improved.

In a preferred aspect of the present invention, the verify means verifies whether or not all flash memory cells constituting said erased block found by said search means are in an erased state.

In a further preferred aspect of the present invention, the flash memory chip and said controller are enclosed in the same package.

In a further preferred aspect of the present invention, the package is card-shaped.

In a further preferred aspect of the present invention, the controller further comprises test means, responsive to said verify means finding said erased block to be a defective block, for performing a test operation to test whether or not said defective block includes a permanent error.

In a further preferred aspect of the present invention, the test means inhibits use of said defective block in response to said defective block being found to include a permanent error.

In a further preferred aspect of the present invention, the flash memory system employs a plurality of flash memory chips, and said store means can store data into an erased block belonging to one flash memory chip while said test means performs said test operation on a defective block belonging to another flash memory chip.

The above and other objects of the present invention can be also accomplished by a method for storing data into a flash memory device divided into a plurality of blocks, comprising the steps of: searching said plurality of blocks to find a block in which to store said data, verifying a state of said block found in said searching step, and storing said data into said block verified by said verifying step.

According to this aspect of the present invention, verification of the states of the erased block in which data are to be stored is performed prior to data writing thereto. Therefore, since improper data cannot be stored, the quality of the data writing is improved.

In a preferred aspect of the present invention, the method further comprises a step of testing, in response to said verifying step finding said block found by said searching step to be unsuitable for storing said data, whether or not said block is a defective block with a permanent error.

According to this preferred aspect of the present invention, in the case where the verifying step finds the block found by the searching step to be unsuitable for storing said data, it is judged whether the block should be excluded. Therefore, exclusion of a defective block having a transient error can be avoided.

In a further preferred aspect of the present invention, the searching step searches another block for storing said data among said plurality of blocks responsive to said verifying step finding said block found by said searching step to be unsuitable for storing said data for finding.

In a further preferred aspect of the present invention, the data are stored into said another block regardless of whether or not said block is found to be a defective block with a permanent error in said testing step.

In another preferred aspect of the present invention, the data are stored into said block if said block is not found to be a defective block with a permanent error in said testing step.

In a further preferred aspect of the present invention, the testing step includes writing and first reading sub-steps for storing and reading first test data to/from all flash memory cells constituting said block.

In a further preferred aspect of the present invention, the said testing step further includes erasing and second reading sub-steps for storing and reading second test data to/from all flash memory cells constituting said erased block.

In a further preferred aspect of the present invention, storage of data in said block is inhibited if said block is found to be a defective block with a permanent error in said testing step.

The above and other objects and features of the present invention will become apparent from the following description made with reference to the accompanying drawings.

BRIEF DESCRIPTION OF THE DRAWINGS

FIGS. 1(a) to 1(d) are schematic diagrams for explaining how a writing operation is not successfully performed owing to the disturb phenomenon.

FIG. 12 is a flow chart showing a vendor format for checking an acquired defect.

DESCRIPTION OF THE PREFERRED EMBODIMENT

Figure 2:
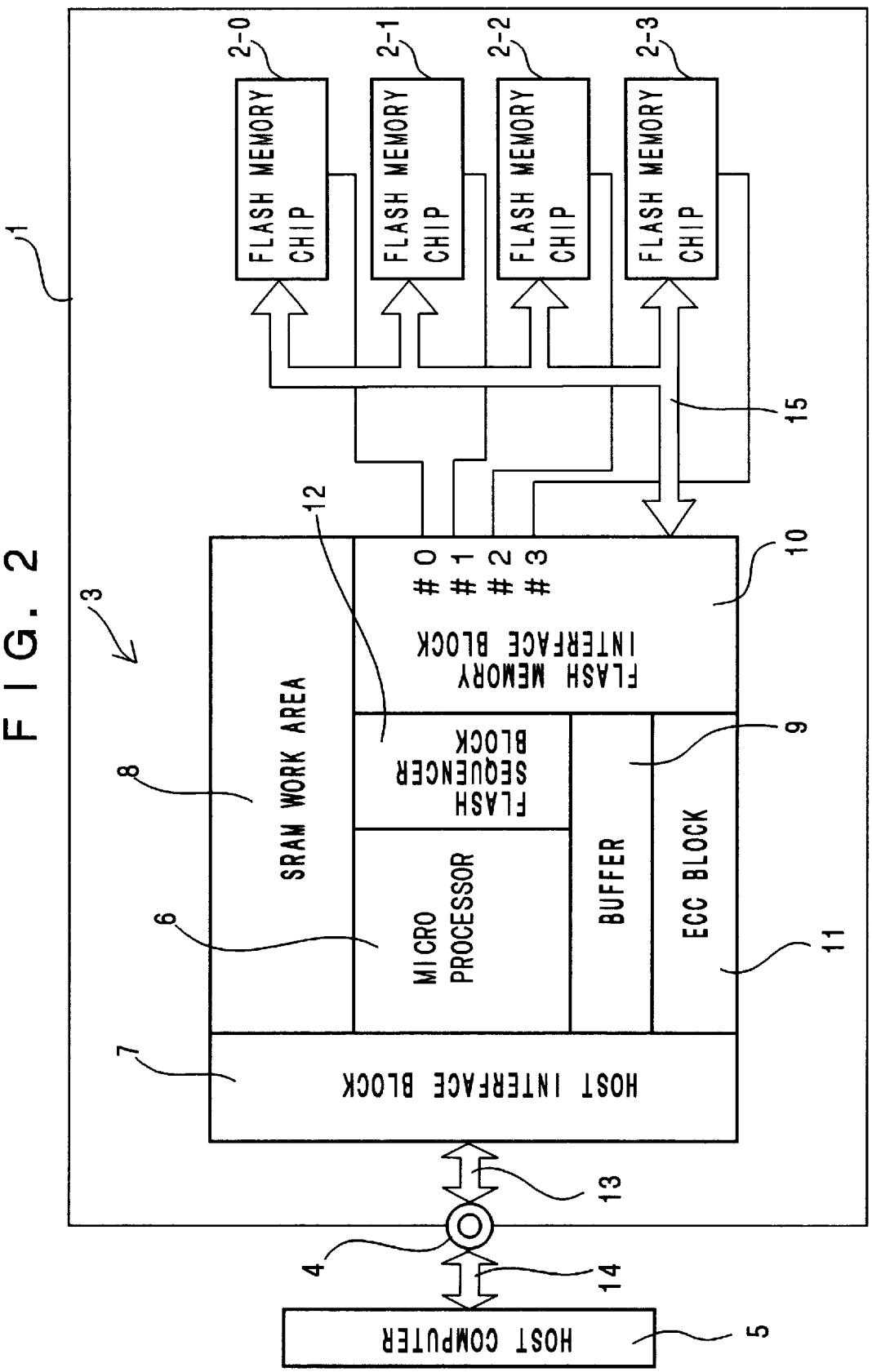
FIG. 2 is a schematic block diagram showing a flash memory system 1 which is a preferred embodiment of the present invention.

As shown in FIG. 2, the flash memory system 1 has the shape of a card, and is composed of four flash memory chips 2-0 to 2-3, a controller 3, and a connector 4, each of which is integrated into the card. The flash memory system 1 can be removably attached to a host computer 5 for use as a kind of an external storage device for the host computer 5. The host computer 5 can be a device such as a personal computer for processing various information such as text data, sound data, and video data and digital still camera data.

Each flash memory chip 2-0 to 2-3 is a semiconductor chip having a capacity of 128 M bytes (1 G bits). In the flash memory system 1, each page, which is a minimum access unit, is composed of 512 bytes for user data. Thus, an address space of each flash memory chip 2-0 to 2-3 includes 256K pages, and the amount of address space of the flash memory chips 2-0 to 2-3 is 1M pages. In the flash memory system 1, these four flash memory chips 2-0 to 2-3 are treated as a big single memory having a capacity of 512 M bytes (4 G bits) and 1M pages of address space. Address information of 20-bit length is required to access such a memory having 1M pages of address space. Thus, to access an individual page, the host computer 5 provides address information of 20-bit length to the flash memory system 1. Such address information of 20-bit length provided from the host computer 5 to the flash memory system 1 is referred as a "host address".

The controller 3 is composed of a microprocessor 6, a host interface block 7, a SRAM work area 8, a buffer 9, a flash memory interface block 10, an ECC (error correction code) block 11, and a flash sequencer block 12. These functional blocks composing the controller 3 are integrated in a single semiconductor chip.

The microprocessor 6 is a functional block which controls the operations of each functional block composing the controller 3.

The host interface block 7 is connected to the connector 4 via a bus 13 to send or receive data, address information, status information, and external command information to/from the host computer 5 under the control of the microprocessor 6. Specifically, when the flash memory system 1 is attached to the host computer 5, the flash memory system 1 and the host computer 5 are electrically connected to each other via the bus 13, the connector 4, and the bus 14. When the electrical connection between the flash memory system 1 and the host computer 5 is established, various information such as data provided from the host computer 5 to the flash memory system 1 is input to the controller 3 via the host interface block 7 as an input part, and various information such as data provided from the flash memory system 1 to the host computer 5 is output from the controller 3 via the host interface block 7 as an output part. Further, the host interface block 7 employs task file registers (not shown) temporarily storing the host address and the external commands from the host computer 5 and error registers (not shown) which is set in response to error occurrence.

The SRAM work area 8, composed of a plurality of SRAM cells, is a working area for temporarily storing data is used by the microprocessor 6 for controlling the flash memory chips 2-0 to 2-3.

The buffer 9 is for temporarily storing data read from the flash memory chips 2-0 to 2-3 and data to be written into the flash memory chips 2-0 to 2-3. Specifically, data read from the flash memory chips 2-0 to 2-3 are temporarily stored in the buffer 9 until the host computer 5 becomes ready to receive them, and data to be written into the flash memory chips 2-0 to 2-3 are temporarily stored into the buffer 9 until the flash memory chips 2-0 to 2-3 become ready to be written.

The flash memory interface block 10 is a functional block for sending or receiving data, address information, status information, and internal command information to/from the flash memory chips 2-0 to 2-3 via a bus 15 and for supplying the chip selection signals #0 to #3 to the flash memory chips 2-0 to 2-3. One of the chip selection signals #0 to #3 is activated based on the upper two bits of the host address provided from the host computer 5 when a data read operation or a data write operation is requested by the host computer 5. Specifically, the chip selection signals #0 is selectively activated based on the upper two bits of the host address being "00", the chip selection signals #1 is selectively activated based on the upper two bits of the host address being "01", the chip selection signals #2 is selectively activated based on the upper two bits of the host address being "10", and the chip selection signals #3 is selectively activated based on the upper two bits of the host address being "11". Each of the chip selection signals #0 to #3 activates a corresponding flash memory chip 2-0 to 2-3 to allow the data read operation and the data write operation to be performed. It is noted that the "internal command information" is distinguished from the "external command information": the internal command information is issued from the controller 3 to control the flash memory chips 2-0 to 2-3; the external command information is issued from the host computer 5 to control the flash memory system 1.

The ECC block 11 is a functional block for generating an error correction code to be added to data to be written to the flash memory chips 2-0 to 2-3 and to correct any error included in data read from the flash memory chips 2-0 to 2-3.

The flash sequencer block 12 is a functional block for controlling a data transport between the flash memory chips 2-0 to 2-3 and the buffer 9. The flash sequencer block 12 has a plurality of registers (not shown). When a certain value necessary for reading data from the flash memory chips 2-0 to 2-3 or to write data into the flash memory chips 2-0 to 2-3 is set in the registers (not shown) under the control of the microprocessor 6, the flash sequencer block 12 performs certain operations necessary to read data or to write data.

Next, the physical structure of each of the flash memory cells included in the flash memory chips 2-0 to 2-3 will be explained.

Figure 3:
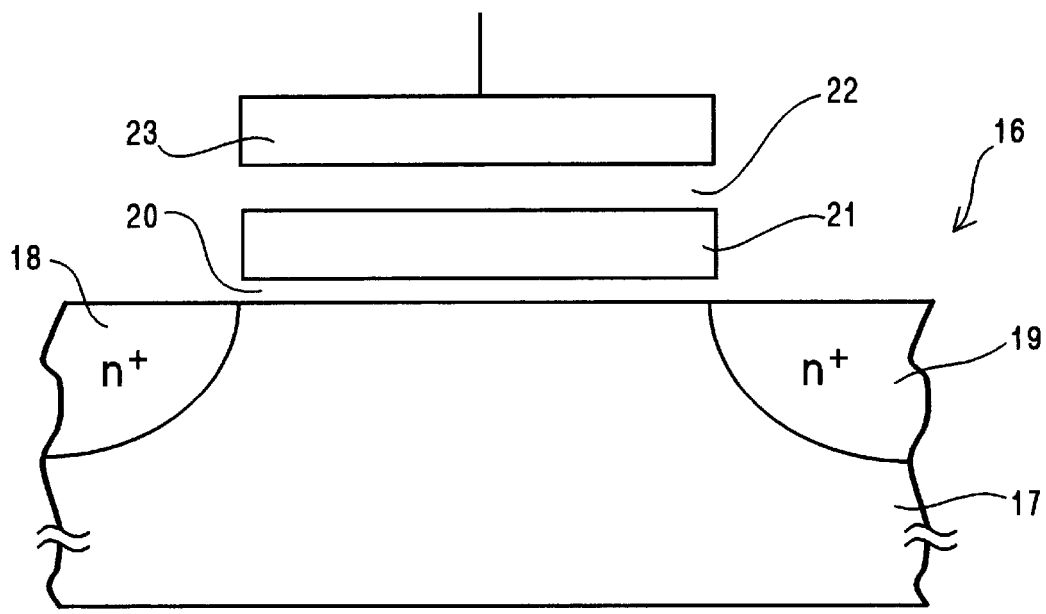
FIG. 3 is a schematic sectional diagram showing a cross-section of a flash memory cell 16 included in the flash memory chips 2-0 to 2-3.

FIG. 3 is a schematic sectional diagram showing a cross-section of a flash memory cell 16 included in the flash memory chips 2-0 to 2-3.

As shown in FIG. 3, the flash memory cell 16 is composed of a semiconductor substrate 17 of p-type, the source and drain diffusion regions 18 and 19 of n-type each of which is formed in the semiconductor substrate 17, the tunnel oxide film 20 formed on a part of the semiconductor substrate 17 located between the source and drain diffusion regions 18 and 19, a floating gate electrode 21 formed on the tunnel oxide film 20, an insulating film 22 formed on the floating gate electrode 21, and a control gate electrode 23 formed on the insulating film 22. In the flash memory chips 2-0 to 2-3, pluralities of the flash memory cells 16 having the above-mentioned structure are serially connected to form a flash memory of NAND type.

The flash memory cell 16 exhibits either an "erased state" or a "programmed state" depending on whether electrons are injected into the floating gate electrode 21. The flash memory cell 16 being in the erased state indicates that the data stored therein is "1", and the flash memory cell 16 being in the programmed state indicates that the data stored therein is "0". That is, each flash memory cell 16 can store one bit of digital data.

As shown in FIG. 3, in the erased state, substantially no electrons are injected into the floating gate electrode 21. In the erased state, when reading voltage is not applied to the control gate electrode 23, no channel is induced at the surface of the semiconductor substrate 17 of p-type located between the source and drain diffusion regions 18 and 19, so that the source and drain diffusion regions 18 and 19 are electrically isolated from each other by the semiconductor substrate 17 of p-type. On the other hand, when reading voltage is applied to the control gate electrode 23, a channel (not shown) is induced at the surface of the semiconductor substrate 17 of p-type located between the source and drain diffusion regions 18 and 19, so that the source and drain diffusion regions 18 and 19 are electrically connected to each other by the channel (not shown). That is, no application of the reading voltage to the control gate electrode 23 causes the source and drain diffusion regions 18 and 19 to be electrically isolated from each other, and application of the reading voltage to the control gate electrode 23 causes the source and drain diffusion regions 18 and 19 to be electrically connected to each other.

Figure 4:
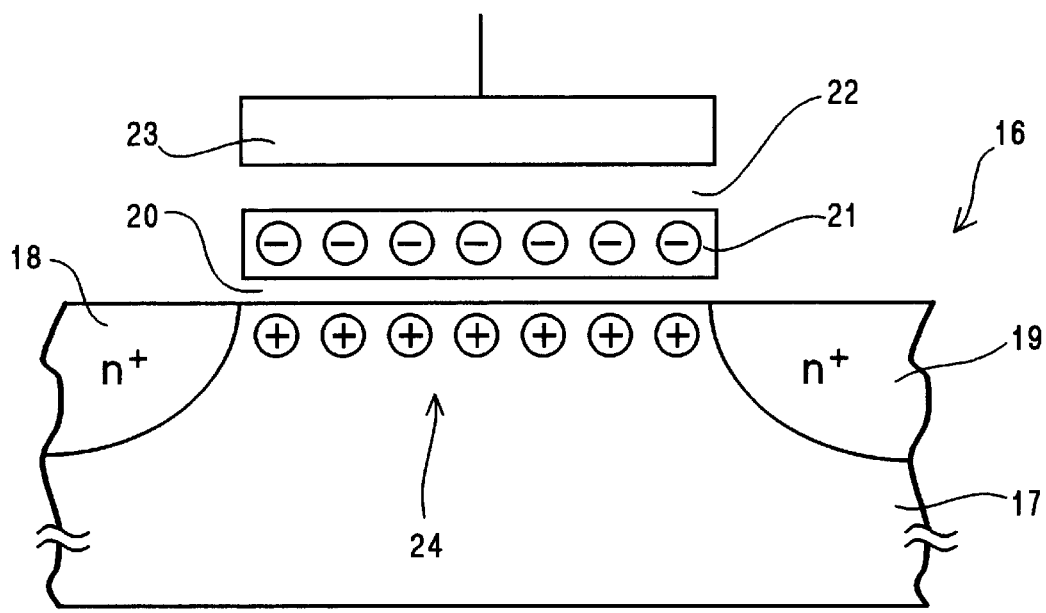
FIG. 4 is a schematic sectional diagram showing a cross-section of the flash memory cell 16 in the programmed state.

FIG. 4 is a schematic sectional diagram showing a cross-section of the flash memory cell 16 in the programmed state.

As shown in FIG. 4, in the programmed state, electrons are injected into the floating gate electrode 21. The electrons injected into the floating gate electrode 21 stay therein for an extremely long period because the floating gate electrode 21 is sandwiched between the tunnel oxide film and the insulating film 22. In the programmed state, a channel 24 is induced at the surface of the semiconductor substrate 17 of p-type located between the source and drain diffusion regions 18 and 19 regardless of whether reading voltage is being applied to the control gate electrode 23. Therefore, the source and drain diffusion regions 18 and 19 are always electrically connected to each other by the channel 24 regardless of whether reading voltage is being applied to the control gate electrode 23.

It can be detected whether the flash memory cell 16 is in the erased state or the programmed state by the following steps. First, reading voltage is applied to every control gate electrode 23 of the flash memory cells 16 except for the selected flash memory cell 16, so that the flash memory cells 16 are serially connected to form a serial circuit. Next, it is detected whether or not current can flow through the serial circuit. Then, the state of the selected flash memory cell 16 is judged to be in the programmed state if current can flow through the serial circuit, and the state of the selected flash memory cell 16 is judged in the erased state if current cannot flow through the serial circuit. In this manner, the data stored in each flash memory cell 16 can be read out. In the flash memory of NAND type, however, two or more data stored in flash memory cells 16 which belong to the same serial circuit cannot be read out simultaneously.

To change the state of the flash memory cell 16 from the erased state to the programmed state, high positive voltage is applied to the control gate electrode 23 to inject electrons into the floating gate electrode 21 via the tunnel oxide film 20. The injection of the electrons into the floating gate electrode 21 can be performed using an F-N tunnel current. On the other hand, to change the state of the flash memory cell 16 from the programmed state to the erased state, high negative voltage is applied to the control gate electrode 23 to eject the previously injected electrons from the floating gate electrode 21 via the tunnel oxide film 20.

Next, the specific structure of the address space of each of the flash memory chips 2-0 to 2-3 will be explained.

Figure 5:
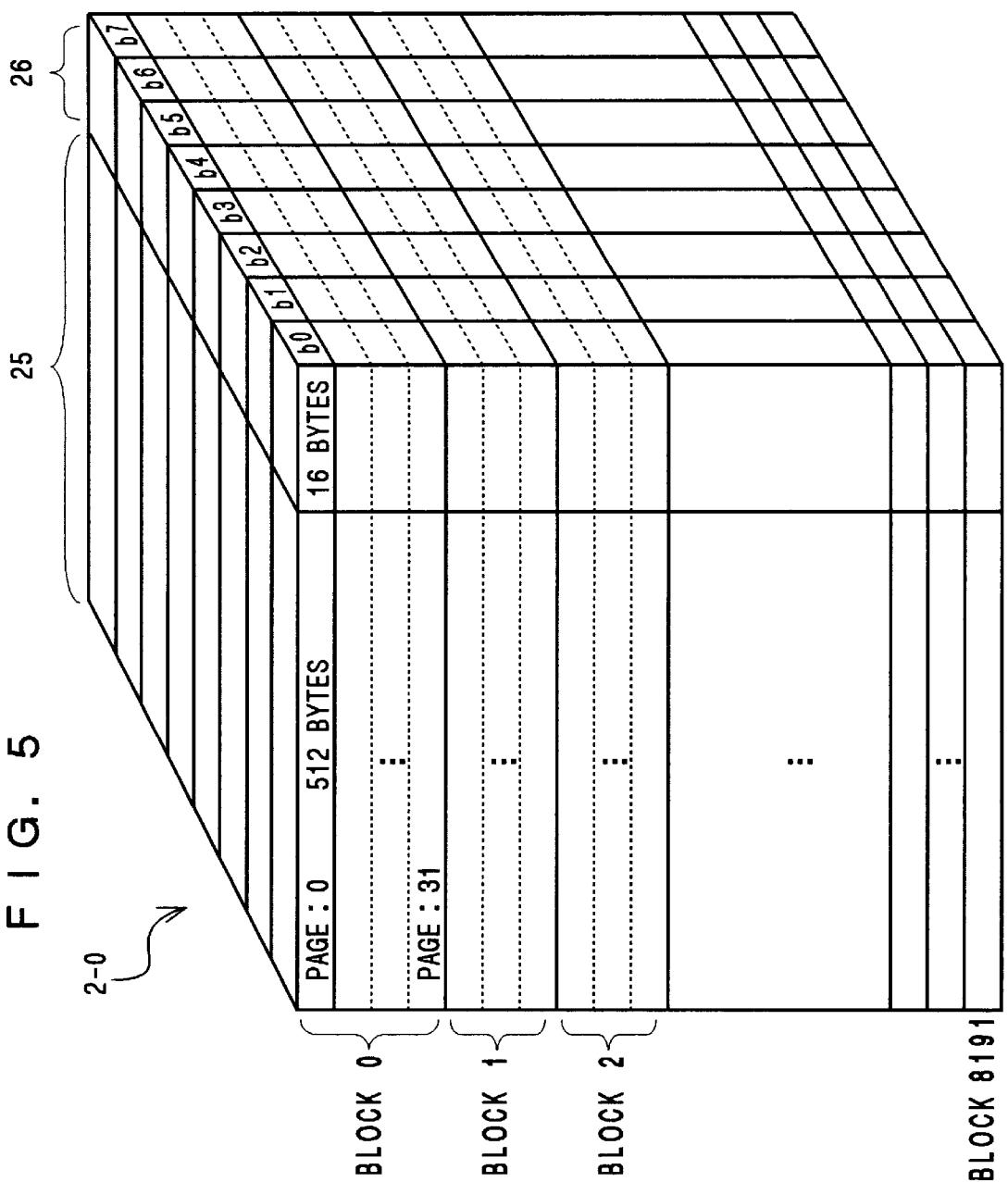
FIG. 5 is a schematic diagram showing the structure of the address space of the flash memory chip 2-0.

FIG. 5 is a schematic diagram showing the structure of the address space of the flash memory chip 2-0.

As shown in FIG. 5, the address space of the flash memory chip 2-0 is divided into 8192 blocks composed of blocks 0 to 8191. Although not shown in FIG. 5, each of the address spaces of the flash memory chips 2-1 to 2-3 is also divided into 8192 blocks: the address space of the flash memory chip 2-1 is composed of block 8192 to 16383, the address space of the flash memory chip 2-2 is composed of blocks 16384 to 24575, and the address space of the flash memory chip 2-3 is composed of blocks 24576 to 32767. Each of the blocks 0 to 32767 has a memory capacity of 16K bytes.

Each block 0 to 32767 is a unit of flash erasing. In other words, according to the flash memory chips 2-0 to 2-3, the state of each flash memory cell 16 cannot be changed from the programmed state to the erased state in cell units. To change the state of the flash memory cell 16 from the programmed state to the erased state, it is required to change the states of all flash memory cells 16 of the block including the flash memory cells 16 to be erased. In contrast, the state of each flash memory cell 16 can be changed from the erased state to the programmed state in cell units.

Further, as shown in FIG. 5, each block 0 to 8191 composing the flash memory chip 2-0 is divided into 32 pages assigned the page addresses 0 to 31, respectively. Similar to the blocks 0 to 8191 composing the flash memory chip 2-0, each block 8192 to 32767 composing the flash memory chips 2-1 to 2-3 is also divided into 32 pages assigned page addresses 0 to 31, respectively.

Each of the pages is an access unit during the read operation and the write operation and is composed of the user area 25 of 512 bytes and the redundant area 26 of 16 bytes where 1 byte is equal to 8 bits composed of bits 0 to 7. The user area 25 is an area for storing user data supplied from the host computer 5 and the redundant area 26 is an area for storing additional information such as the error correction code generated by the ECC block 11. The error correction code is a piece of additional information for correcting any error included in data stored in the corresponding user area 25. If the number of errors included in data stored in the user area 25 is smaller than a certain number, the errors are corrected by using the error correction code stored in the corresponding redundant area 26.

The host computer 5 supplies the host address to the flash memory system 1, which employs the flash memory chips 2-0 to 2-3 having the above-mentioned structure, to request read operation and write operation of individual pages as access units composed of 512 bytes. Because each page is composed of the user area 25 of 512 bytes and the redundant area 26 of 16 bytes, each page includes 8×(512 bytes+16 bytes)=4224 flash memory cells.

Because the flash memory chips 2-0 to 2-3 having the above-mentioned structure are treated as a big single memory having 1M pages of address space, address information of 20-bit length is required to access individual pages included in the address space. Among the 20 bits, the upper 15 bits are used to select a particular blocks to be accessed among the 32768 blocks composed of the blocks 0 to 32767 and the remaining lower 5 bits are used to select a particular page to be accessed among the 32 pages composing the selected block. As explained in further detail later, the block to be accessed cannot be univocally decided by the upper 15 bits of the host address supplied from the host computer 5. The upper 15 bits of the host address is referred as a "logical block address" and the physical address of the block to be accessed is referred as a "physical block address" which is not the same as the logical block address. The logical block address is converted into the physical block address by referring to an address translation table which will be explained later, whereafter the specific block assigned such a physical block address is accessed.

The need for converting the logical block address into the physical block address by referring to the address translation table will be explained.

As mentioned above, although the state of each flash memory cell 16 composing the flash memory chips 2-0 to 2-3 can be changed from the erased state to the programmed state in cell units, the state of the flash memory cells 16 cannot be changed from the programmed state to the erased state in cell units, the state change can be only performed in block units. Thus, to store new data into a certain page, it is required that every flash memory cell 16 composing the user area 25 of the page be in the erased state. In other words, if even a single flash memory cell 16 included in the page into which data are stored is in the programmed state, overwriting of other data into such a page cannot be directly performed. Therefore, to overwrite new data into such a page already storing other data a flash erasing operation must be performed in advance to change the states of all of the flash memory cells 16 of the block including the page into which data are to be overwritten to the erased state, whereafter new data are written into the page.

Therefore, in case of overwriting new data into a certain page already storing other data, the data already stored in other pages belonging to the same block must be moved to other pages belonging to another block in order to avoid destruction of such data. Hence, the relationship between the logical block address included in the host address and the physical block address assigned to each block of the flash memory chips 2-0 to 2-3 corresponding to the logical block address is actively changed each time an overwrite operation is requested by the host computer 5. Thus, to access the flash memory chips 2-0 to 2-3 from the host computer 5, an address translation table for converting the logical block address provided from the host computer 5 into the physical block address corresponding to the logical block address is required. The address translation table will be specifically explained later.

In the redundant area 26 of the top page (page 0) of each block, not only the error correction code but also an erase flag and a corresponding logical block address are stored. The erase flag is a flag indicating whether or not all of the flash memory cells 16 composing the user areas 25 of the block are in the erased state, i.e., indicating whether or not the block is an erased block, and the corresponding logical block address indicates by what logical block address the block is accessed. The corresponding logical block address is stored in case some data are stored in the block, i.e., when the erase flag indicates that the block is not an erased block. The erase flag and the corresponding logical block address will be explained in detail later.

Next, various working data stored in the SRAM work area 8 will be explained. At least an address translation table 27 and a write queue 28 are stored in the SRAM work area 8.

Figure 6:
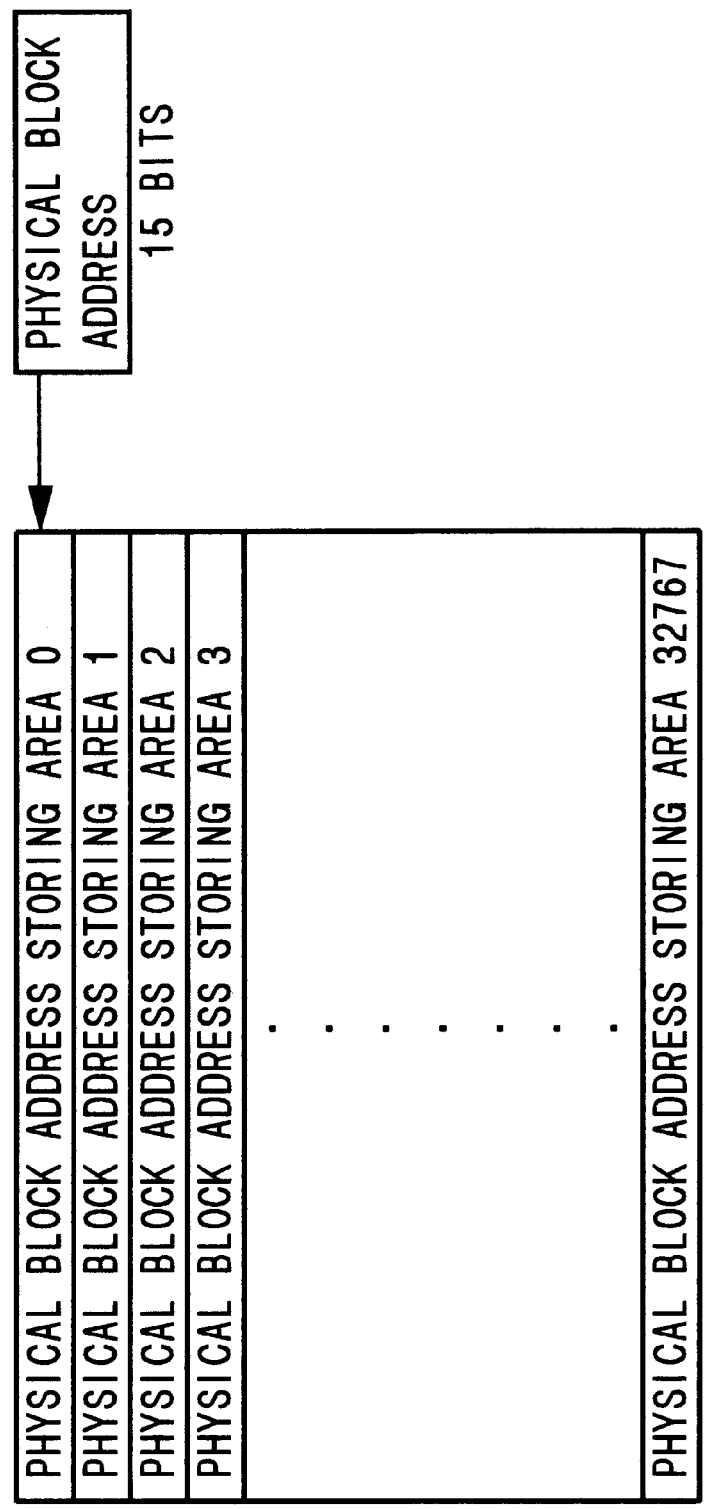
FIG. 6 is a schematic diagram showing the data structure of an address translation table 27 stored in a SRAM work area 8.

FIG. 6 is a schematic diagram showing the data structure of the address translation table 27 stored in the SRAM work area 8.

As shown in FIG. 6, the address translation table 27 is composed of physical block address storing areas 0 to 32767. In the physical block address storing areas 0 to 32767, corresponding physical block addresses are stored, so the logical block addresses and the physical block addresses are related. Specifically, the logical block addresses 0 to 32767 are assigned to the physical block address storing areas, so that each of the physical block addresses stored in the physical block address storing areas is related to the logical block address assigned thereto. For example, if the logical block address (upper 15 bits of the host address) supplied from the host computer 5 is 010101010101010B, the physical block address storing area assigned 10922 as the logical block address is selected, and the physical block address stored therein is read out. If the read physical block address is for example 000001111111111B, the physical block address to be accessed is decided to be 1023, so that conversion of the logical block address 10922 into the physical block address 1023 is completed.

Each of the physical block address storing areas 0 to 32767 occupies 15 bits of the SRAM work area 8 to store the physical block address. Thus, the address translation table 27 occupies 61.44K bytes (491520 bits) of the SRAM work area 8.

The address translation table 27 is generated in the following manner.

As mentioned above, not only the error correction code generated by the ECC block 11 but also the "corresponding logical block address", which indicates the logical block address by which the block is accessed, is stored in the redundant area 26 of the top page (page 0) of the block which stores data. Because it can be detected whether the block stores data or not by referring to the "erase flag", a search operation is performed under the control of the microprocessor 6 to detect the blocks storing data by checking their erase flags, and the corresponding logical block addresses are read from the redundant area 26 of the top page (page 0) of the block storing data via the flash memory interface block 10. Then, the physical block addresses are stored in the physical block address storing areas assigned the same logical block addresses as the read corresponding logical block addresses. For example, if the physical block address of a certain block is "10" and the corresponding logical block address stored therein is "123," "10" is stored as the physical block address in the physical block address storing area assigned "123" as the logical block address. Then, address translating information according to the certain block, whose physical block address is "10", is completed.

Such an operation is performed for each block which contains data, so that each of the physical block addresses assigned to such blocks that contains data are stored into corresponding physical block address storing areas.

Next, the data structure of the write queue 28 stored in the SRAM work area 8 will be explained.

Figure 7:
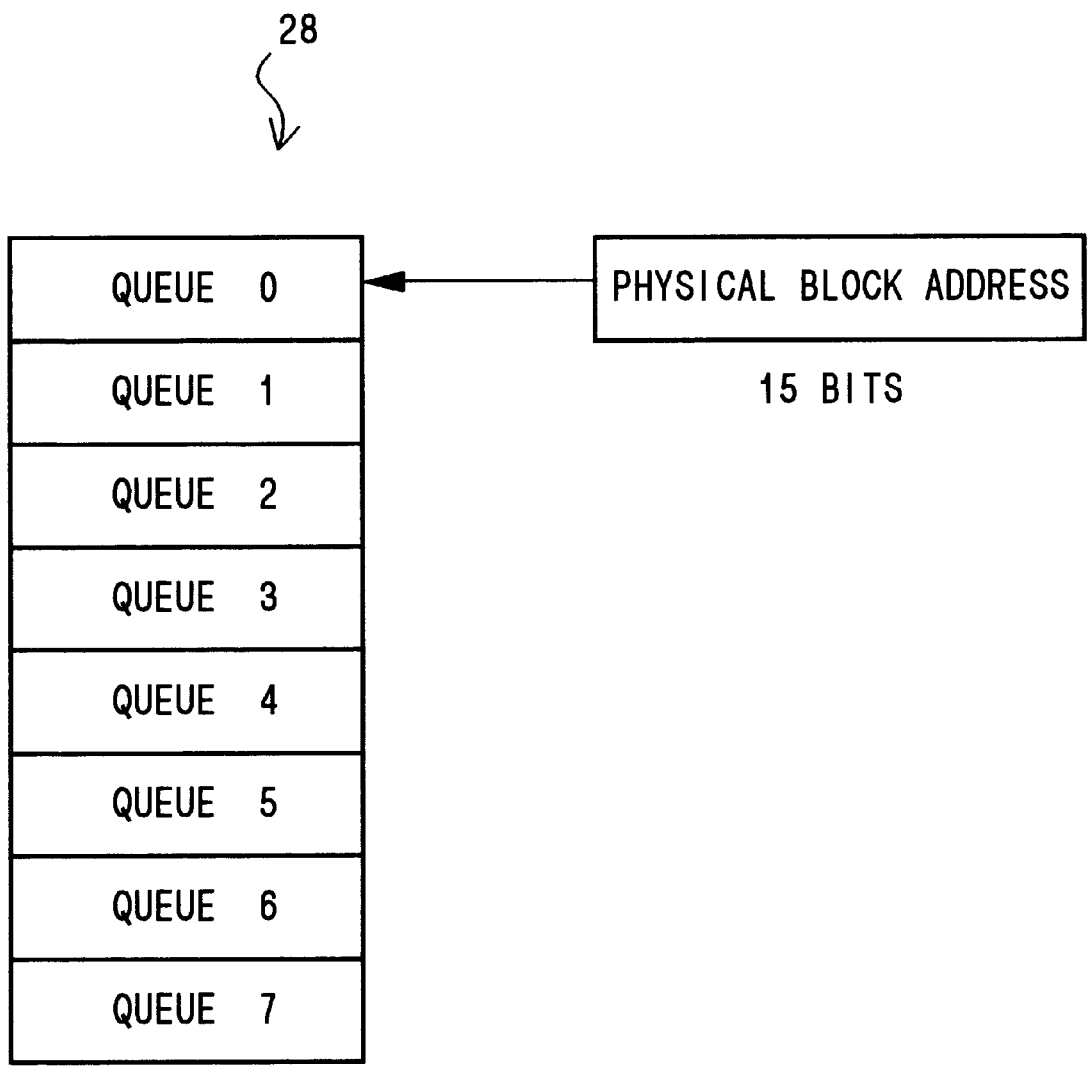
FIG. 7 is a schematic diagram showing the data structure of a write queue 28 stored in the SRAM work area 8.

FIG. 7 is a schematic diagram showing the data structure of the write queue 30 stored in the SRAM work area 8.

As shown in FIG. 7, the write queue 28 is composed of the queues 0 to 7. Each of the queues 0 to 7 occupies 2 bytes of the SRAM work area 8, and a physical block address is stored in each of the queues 0 to 7 by 15 bits of data. Thus, the write queue 28 occupies 16 bytes of the SRAM work area 8.

Each of the queues 0 to 7 stores the physical block addresses of the erased blocks, i.e., all flash memory cells 16 composing the used area 25 are in the erased state. Therefore, the write queue 28 can store at most eight physical block addresses of the erased blocks.

The generation of the write queue 28 is performed under the control of the microprocessor 6 during the generation of the address translation table 27.

Specifically, as mentioned above, the erase flag indicating whether or not the corresponding block is an erased block is included in the redundant area 26 of the top page (page 0) of each of the blocks, and the contents of the erase flags, which are included in the area whose address translating information should be stored in the address translation table 27, are checked to detect erased blocks under the control of the microprocessor 6 during the generation of the address translation table 27. By this operation, at most eight erased blocks are detected and the physical block addresses thereof are stored in the corresponding the queues 0 to 7.

Next, the initializing operation and write operation of the flash memory system 1 will be explained in this order.

The initialization of the flash memory system 1 is performed at the time the flash memory system 1 is attached to the host computer 5 or a reset command is issued from the host computer 5.

In the initialization of the flash memory system 1, the address translation table 27 and the write queue 28 are generated under the control of the microprocessor 6. Generating method thereof are already mentioned. When the address translation table 27 and the write queue 28 have been generated, the initialization of the flash memory system 1 is finished.

The controller 3 is placed in a busy state during the initialization of the flash memory system 1. When in this state, the controller 3 denies requests for data reading or writing from the host computer 5. The busy state is released in response to completion of flash memory system 1 initialization.

Next, the write operation of the flash memory system 1, a characterizing feature of the present invention, will be explained.

Figure 8:
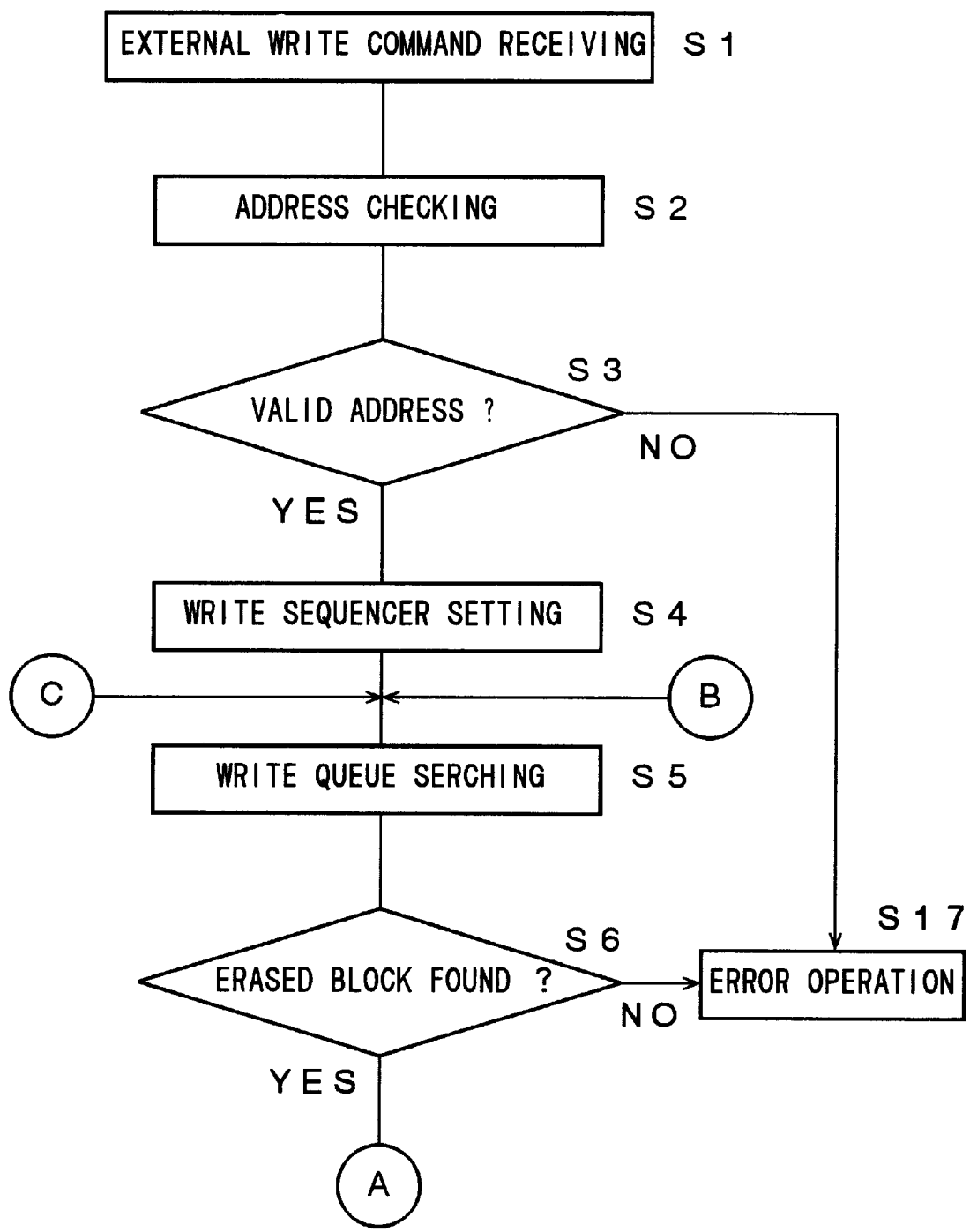
FIGS. 8 to 10 are flow charts showing the data writing operation by the flash memory system 1.
Figure 9:
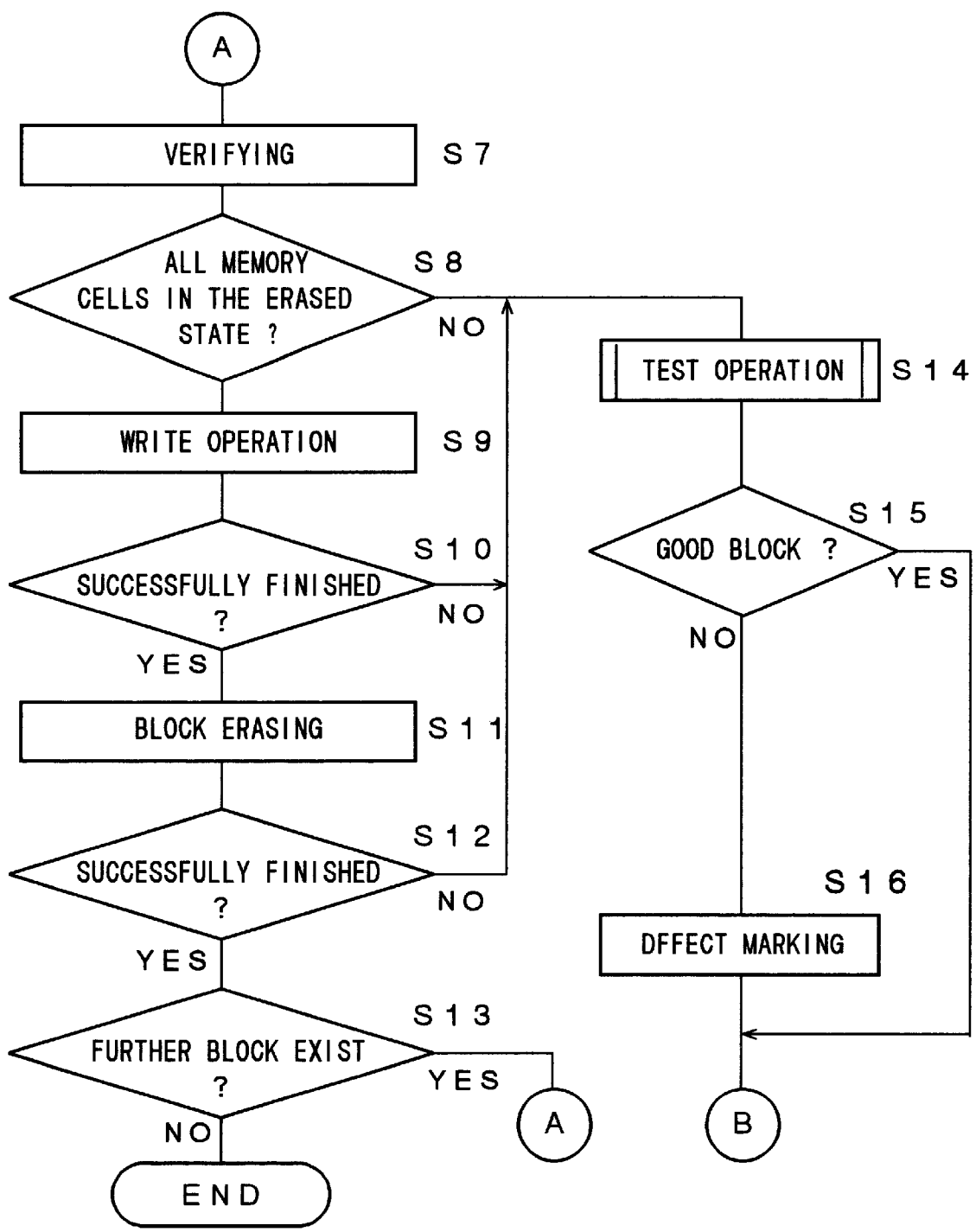
Figure 10:
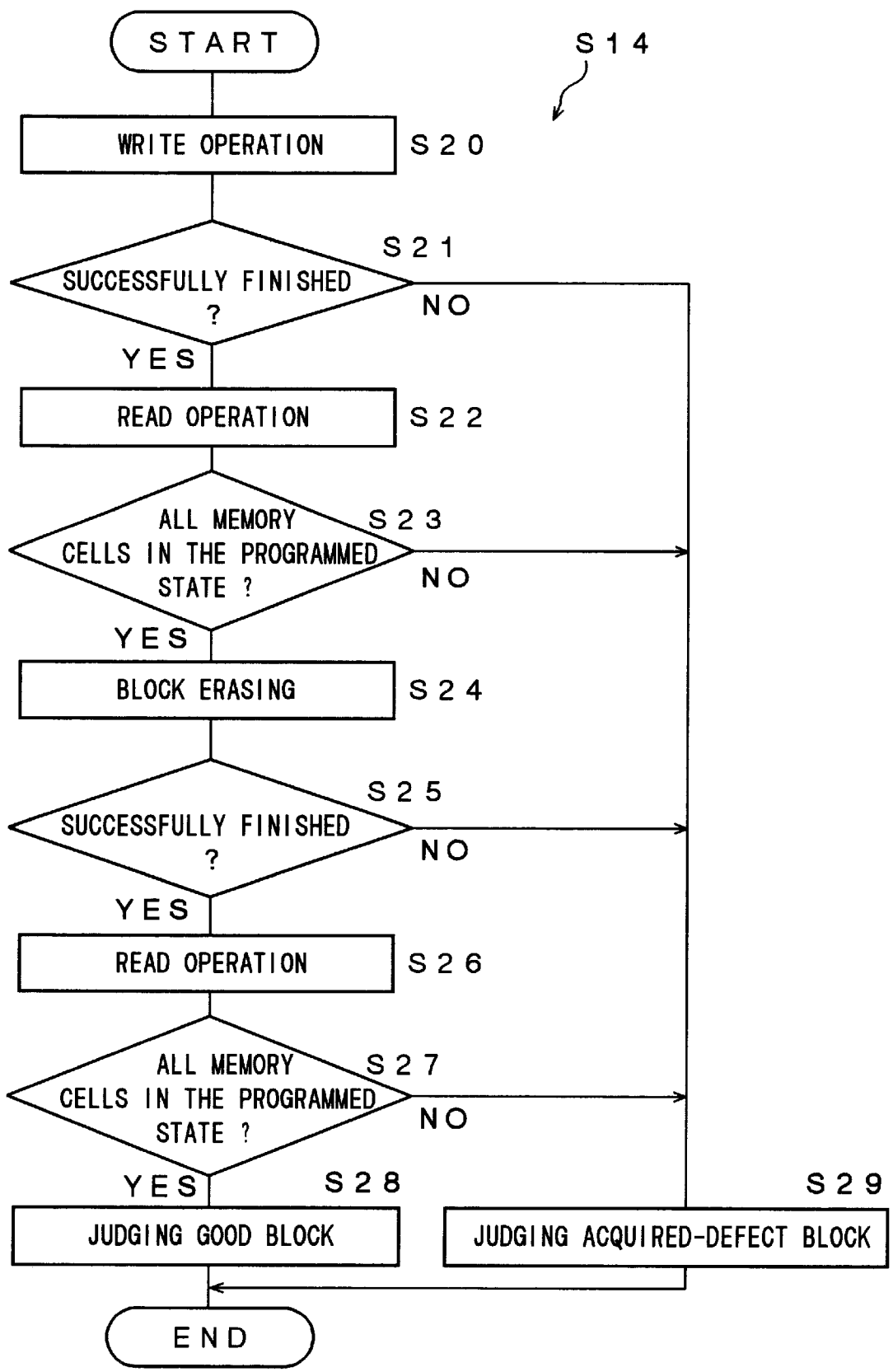

FIGS. 8 to 10 are flow charts showing the data writing operation by the flash memory system 1.

The write operation will be explained for the case where the address translation table 27 and write queue 28 are in the initial state when the external write command, a kind of external command, the host address 11000000100100111011B, for example, and data to be written are supplied to the flash memory system 1 via the bus 14, the connector 4, and the bus 13 from the host computer 5.

First, when the host address and the external write command are supplied to the controller 3, they are temporarily stored in the task file register (not shown) of the host interface block 7 (step S1).

Next, the host address stored in the task file register is checked for whether it is invalid, for example, is an nonexistent address, an invalid address, or the like, by the host interface block 7 (step S2).

When the check finds the host address stored in the task file register to be valid, the operation proceeds to step S4. When the host address is found to be invalid, the operation proceeds to step S17 (step S3). When the operation proceeds to step S17, the error register (not shown) of the host interface block 7 is set, so that the host computer 5 can ascertain occurrence of any error by referring to the error register. When the operation proceeds to step S4, the registers (not shown) included in the flash sequencer block 12 are set under the control of the microprocessor 6 (write sequencer setting). This operation is performed as follows:

First, the internal write command and the internal read command, each of which is a kind of internal command, are set in the predetermined registers (not shown) included in the flash sequencer block 12 under the control of the microprocessor 6. Further, the upper 2 bits are extracted from the 20 bits of the host address and set in the other registers (not shown) included in the flash sequencer block 12 under the control of the microprocessor 6. Further, the source block address, which is the physical block address of the block storing the data prior to transfer, and the destination block address, which is the physical block address of the block in which transferred data will be stored, are set in other registers (not shown) included in the flash sequencer block 12 under the control of the microprocessor 6.

In accordance with the generation of the source block address, the upper 15 bits are extracted from the 20 bits of the host address, and then, the physical block address, which is stored in the physical block address storing area determined by the extracted 15 bits among the 32768 physical block address storing areas composed of the physical block address storing area 0 to 32767, is read out under the control of the microprocessor 6. In the exemplified case, because the extracted 15 bits of the host address are 110000001001001B (24649), the physical block address stored in the 24650th physical block address storing area, which is the physical block address storing area 24649, is read out. Here, assume that the physical block address stored in the physical block address storing area 24649 is 000001110001111B(911). This is the source block address, and it is set in a register (not shown) included in the flash sequencer block 12.

On the other hand, in accordance with the generation of the destination block address, the content of the write queue 28 is searched under the control of the microprocessor 6 (step S5). When it is found that no address of an erased block is stored in any of queues 0 to 7 at all, i.e., no erased block is found, the operation proceeds to step S17 to perform the error operation. On the other hand, if an address of an erased block is stored in at least one of queues 0 to 7, i.e., at least one erased block is found, the operation proceeds to step S7 shown in FIG. 9 (step S6). In the case where the operation proceeds to step S7, the physical block address is read out from one of the queues 0 to 7, the queue 0 for example, composing the write queue 28. Here, assume that the physical block address stored in the queue 0 is 000001000000000B(512). This is the destination block address, and it is set in a register (not shown) included in the flash sequencer block 12.

In the meantime, write data are supplied from the host computer 5 to the flash memory system 1, and are transferred to the ECC block 11 under the control of the microprocessor 6. The ECC block 11 analyzes the transferred write data to generate and temporarily store an error correction code.

When the physical block address 000001000000000B (512) stored in the queue 0 is read out, it is confirmed whether or not all flash memory cells 16 constituting the block 512 are erased states (all "1") under the control of the flash sequencer block 12 (step S7).

Specifically, when the physical block address 000001000000000B(512) stored in the queue 0 is read out, at first 0000B is added to the address to generate an internal address 00000100000000000000 under the control of the flash sequencer block 12. Next, the flash sequencer block 12 directs the flash memory interface block 10 to activate the one of the chip selection signals #0 to #3 corresponding to the flash memory chip to be accessed among the flash memory chips 2-0 to 2-3 based on the upper 2 bits of the internal address. In the exemplified case, because the upper 2 bits of the internal address are 00B(0), the chip selection signal #0 is activated. Therefore, access to the flash memory chip 2-0 for reading data is enabled. The other chip selection signals #1 to #3 are kept in the inactive state.

Next, the flash sequencer block 12 directs the flash memory interface block 10 to send the lower 18 bits of the internal address, which are 000100000000000000B, and the internal read command stored in the prescribed registers (not shown) to the bus 15. Although the internal address of 18 bits and the internal read command are provided in common to the flash memory chips 2-0 to 2-3 via the bus 15, they are only valid for the flash memory chip 2-0 because the chip selection signal #0 is in the active state while the other the chip selection signals #1 to #3 are in the inactive state.

As a result, the flash memory chip 2-0 is brought into an enabled state to read data stored at the internal address of 18 bits, 000100000000000000B. The upper 13 bits of the internal address of 18 bits are used to select the block to be accessed and the lower 5 bits of the internal address of 18 bits are used to select the page to be accessed included in the selected block. In the exemplified case, the block 512 and the page 0 are selected. That is, the flash memory chip 2-0 reads data stored at the page 0 of the block 512.

When the reading operation from the page 0 is completed, the internal address is incremented to generate the new internal address 000001000000000001B. Then, the reading operation is performed using the new internal address by the same method as described above. Such data reading operations are successively performed until page 31. That is, the data stored in all pages of the block 512 of the flash memory chip 2-0 are read out.

Then, it is judged whether or not all read data are "1", i.e., whether or not all flash memory cells 16 included in the block 512 are in the erased state (step S8). This means that verification of the erased states of all flash memory cells 16 included in the block is performed prior to the writing operation during steps S7 and S8, even though all flash memory cells 16 included in the block should be in the erased state because a physical address of the block was obtained from the write queue 28 in which physical block addresses of the erased blocks are stored. If as a result of the judgment all flash memory cells 16 are found to be in the erased state, the operation proceeds to step S9 to perform the writing operation. On the other hand, if at least one flash memory cell 16 is found in the programmed state, the operation proceeds to step S14 to perform a test operation.

In step S14, it is checked whether the error of the block 512 is a transient error caused by, for example, states of flash memory cells being accidentally changed owing to the disturb phenomenon or the like, or a permanent error caused by, for example, flash memory cells being physically degraded to preclude data storage.

The test operation of step S14 is performed following the flow chart shown in FIG. 10.

In the test operation, at first, write operations are performed to all flash memory cells 16 included in the block 512 (step S20). Specifically, an internal address 000100000000000001B selecting the page 0 of the block 512, "all 0" as the write data, and an internal write command set in a register (not shown) are supplied to the bus 15 to write data "all 0" in the page 0 of the block 512. That is, the states of all flash memory cells 16 constituting the page 0 of the block 512 are changed from the erased state to the programmed state. Next, the internal address is incremented so that data "all 0" are written into the page 1. Such operations are successively performed until page 31. Then, the write operation for all flash memory cells 16 constituting the block 512 is completed.

When the write operation is completed, it is judged whether or not the write operation was successfully finished (step S21). This judgment can be made by referring a write status signal issued from the flash memory chips 2-0 to 2-3 in response to completion of the write operation. If as a result of the judgment it is found that the write status indicates that the write operation was not successfully finished, the operation proceeds to step S29 because the block is determined to be an acquired-defect block having a permanent error. On the other hand, if the write status indicates that the write operation was successfully finished, the operation proceeds to step S22.

In accordance with step S22, the reading operation is performed for all flash memory cells 16 constituting the block 512. Specifically, the internal address 000100000000000000B selecting the page 0 of the block 512 is supplied to the bus 15 with the chip selection signal #0 being in the active state to read data stored in page 0 of the block 512. Next, the internal address is incremented to read data stored in page 1 of the block 512. Such the reading operations are successively performed until page 31. This completes the read operation for all flash memory cells 16 constituting the block 512.

When the read operation is completed, it is judged whether all bits of the read data are "0," under the control of the flash sequencer block 12 (step S22). If as a result of the judgment it is found that at least one bit indicates "1," the operation proceeds to step S29 because the block is determined to be an acquired-defect block having a permanent error. On the other hand, if all bits of the read data are "0", the operation proceeds to step S24.

In step S24, block erasing is performed for all flash memory cells 16 constituting the block 512. The block erasing is done for the entire block at one time as described above.

When the block erasing is completed, it is judged whether or not the block erasing was successfully finished (step S25). This judgment can be made by referring to an erase status signal issued from the flash memory chips 2-0 to 2-3 in response to completion of the block erasing. If as a result of the judgment it is found that the erase status indicates that the block erasing was not successfully performed, the operation proceeds to step S29 because the block is determined to be an acquired-defect block having a permanent error. On the other hand, if the erase status indicates that the block erasing was successfully performed, the operation proceeds to step S26.

In step S26, a reading operation is performed for all flash memory cells 16 constituting the block 512, similarly to step 22. Details of the read operation have already been explained.

When the read operation is completed, it is judged whether or not all bits of the read data are "1," under the control of the flash sequencer block 12 (step S27). If as a result of the judgment it is found that at least one bit indicates "0," the operation proceeds to step S29 because the block is determined to be an acquired-defect block having a permanent error. On the other hand, if all bits of the read data are "1," the operation proceeds to step S28 because the block is determined to be a good block.

In the test operation (step S14) described above, it is tested whether or not the state of each flash memory cell 16 constituting the block 512 can change from the erased state to the programmed state and from the programmed state to the erased state. As a result, in the case where it was confirmed that the state transition can be successfully performed, the error detected at step S8 is considered to be an accidentally occurring error owing to the disturb phenomenon or the like, so the block is treated as a good block. On the other hand, in the case where it was confirmed that the state transition cannot be successfully performed, the error detected at step S8 is considered to be a permanent error, so the block is treated as an acquired-defect block.

In the test operation (step S14), if the block is determined to be an acquired-defect block, the operation proceeds to step S16, and if the block is determined to be a good block, the operation proceeds to step S5 shown in FIG. 8 (step S15).

In step S16, an exclusion operation is performed to inhibit use of the defect block. Specifically, a block status included in a redundant area 26 of the top page (page 0) is brought into a state to indicate that the block is an acquired-defect block. Then, use of the block is inhibited. When the exclusion operation is completed, the operation proceeds to step S5. Details of the operations performed in steps S5 to S8 have already been explained.

It is found in step S8 that the states of all flash memory cells 16 are in the erased state, a write operation for storing data supplied from the host computer 5 is performed (step S9).

Specifically, the flash sequencer block 12 directs the flash memory interface block 10 to activate the one of the chip selection signals #0 to #3 corresponding to the flash memory chip to be accessed among the flash memory chips 2-0 to 2-3 based on the upper 2 bits of the source block address. In the exemplified case, because the upper 2 bits of the source block address are 00B(0), the chip selection signal #0 is activated. Therefore, access of the flash memory chip 2-0 for reading data is enabled. The other chip selection signals #1 to #3 are kept in the inactive state.

Next, the flash sequencer block 12 generates an internal source address of 18 bits based on the source block address stored in a register (not shown). Specifically, the upper 2 bits are deleted from and 00000B is added to the source block address to generate the internal source address, whose value is therefore 000111000111100000B.

Next, the flash sequencer block 12 directs the flash memory interface block 10 to send the internal source address, 000111000111100000B, and an internal read command stored in the prescribed registers (not shown) to the bus 15. Although the internal source address of 18 bits and the internal read command are provided in common to the flash memory chips 2-0 to 2-3 via the bus 15, they are only valid for the flash memory chip 2-0 because the chip selection signal #0 is in the active state while the other the chip selection signals #1 to #3 are in the inactive state.

The flash memory chip 2-0 performs a reading operation to read data stored at the internal source address of 18 bits, 000111000111100000B. The upper 13 bits of the internal source address of 18 bits are used to select the block to be accessed and the lower 5 bits of the internal source address of 18 bits are used to select the page to be accessed included in the selected block. In the exemplified case, the block 911 and page 0 are selected because the upper 13 bits are 0001110001111B and the lower 5 bits is 00000B. That is, the flash memory chip 2-0 reads data stored at page 0 of the block 911.

By the above operations, the user data read from the flash memory chip 2-0 are supplied to the flash memory interface block 10 via the bus 15. When the flash memory interface block 10 receives the user data, the user data are transferred to the buffer 9 and the ECC block 11 to temporarily store them in the buffer 9 and to generate the error correction code. The error correction code is temporarily stored in the ECC block 11.

Next, the write operation of the data temporarily stored in the buffer 9 is performed.

Specifically, the flash sequencer block 12 generates the internal destination address of 18 bits by deleting the upper 2 bits from and adding 00000B to the destination block address. That is, the internal destination address is 000100000000000000B.

Next, the flash sequencer block 12 directs the flash memory interface block 10 to send the internal destination address of 18 bits, 000100000000000000B, and the internal write command stored in the prescribed registers (not shown) to the bus 15. Although the internal address of 18 bits and the internal read command are provided in common to the flash memory chips 2-0 to 2-3 via the bus 15, they are only valid for the flash memory chip 2-0 because the chip selection signal #0 is in the active state while the other the chip selection signals #1 to #3 are in the inactive state.

As a result, the flash memory chip 2-3 is enabled to write the user data at the given internal address of 18 bits, 000100000000000000B. Because the upper 13 bits of the given internal address of 18 bits are used to select the block to be accessed and the lower 5 bits of the given internal address of 18 bits are used to select the page to be accessed included in the selected block, page 0 of the block 512 is selected.

Next, the user data to be written temporarily stored in the buffer 9 are supplied to the bus 15 via the flash memory interface block 10 under the control of the flash sequencer block 12. Although the user data supplied to the bus 15 is supplied in common to the flash memory chips 2-0 to 2-3, it is only valid for the flash memory chip 2-0 because only the chip selection signal #0 is in the active state.

Then, the user data are written into the user area 25 of page 0 of the block 512 of the flash memory chip 2-0 because the flash memory chip 2-0 is enabled to perform writing of user data thereto. Further, the error correction code temporarily stored in the ECC block 11 is supplied to the bus 15 via the flash memory interface block 10. Then, the error correction code is written into the redundant area 26 of page 0 of the block 512 of the flash memory chip 2-0 because the flash memory chip 2-0 is enabled to perform writing of the error correction code thereto. This completes the transfer of data from page 0 of the block 911 to page 0 of the block 512.

Next, the internal source address is incremented to generate the new internal source address 000111000111100001B. Then, data stored in the page (page 1) selected by the new internal source address 000111000111100001B is read out for temporary storage in the buffer 9 by the above-mentioned operations.

Further, the internal destination address is incremented to generate the new internal destination address 0001000000000000001B. Then, the data temporarily stored in the buffer 9 is written into the page (page 1) selected by the new internal destination address 0001000000000000001B by above-mentioned operations. This completes the transfer of data from page 1 of the block 911 to page 1 of the block 512.

Such data transferring operations are successively performed until the lower 5 bits of the internal source address are the same as the lower 5 bits of the host address, which is 11011B(27). Specifically, when the lower 5 bits of the internal source address become the same as the lower 5 bits of the host address 11011B(27) during the above-mentioned increment operation, the read operation for the block 911 using the internal source address is temporarily suspended. Then, the flash sequencer block 12 increments the internal destination to generate the new internal destination address 0001000000000011011B and performs the write operation to write user data, which is supplied from the host computer 5 and stored in the buffer 9, into the page selected by the new internal destination address 0001000000000011011B.

When the write operation of the user data supplied from the host computer 5 is completed, the internal source address is incremented to generate the new internal source address 0001110001111111100B. Then, the read operation for the block 911 using the internal source address is restarted so that data stored in the page (page 28) selected by the new internal source address 0001110001111111100B is read out for temporary storage in the buffer 9.

Similarly, the internal destination address is also incremented to generate the new internal destination address 0001000000000011100B. Then, the data temporarily stored in the buffer 9 is written into the page (page 28) selected by the new internal destination address 0001000000000011100B by the above-mentioned operations. This completes the transfer of data from page 28 of the block 911 to page 28 of the block 512.

Such data transferring operations are successively performed until data transfer from the final page (page 31) of the block 911 to the final page (page 31) of the block 512 is completed. That is, when data transfer from the final page (page 31) of the block 911 to the final page (page 31) of the block 512 is completed, the sequential write operation under the control of the flash sequencer block 12 is completed.

Further, the microprocessor 6 updates the content of the physical block address storing areas 24649 of the address translation table 27 from 00000011100001111B (911) to 000001000000000B (512) in response to the above-mentioned write operation. The relationship between the logical block address 110000001001001B (24649) and the physical block address 000001000000000B (512) is thus established.

When the write operation (step S9) is completed, the operation proceeds to a step S10 to judge whether or not the write operation was successfully finished. This judgment can be made by referring to the write status signal.

If as a result of the judgement it is found that the write status indicates that the write operation was successfully finished, the operation proceeds to step S11. On the other hand, if the write status indicates that the write operation was not successfully finished, the operation proceeds to step S14. In step S11, the source block (block 911) is block-erased.

When the block erasing is completed, it is judged whether the block erasing was successfully finished (step S12). This judgment can be made by referring to the erase status signal issued from the flash memory chips 2-0 to 2-3. If as a result of the judgement it is found that the erase status indicates that the block erasing was successfully performed, the operation proceeds to step S13 and the block is treated as new erased block. On the other hand, if the erase status indicates that the block erasing was not successfully performed, the operation proceeds to step S14.

In the step S13 it is judged whether or not further blocks to be subjected to data writing operation exist. Specifically, the data writing operation from the host computer 5 is requested not only for a single page as mentioned above but also for a plurality of pages whose logical addresses are successive. The plurality of pages may belong to two or more blocks. In the case where the plurality of pages belong to two or more blocks, a plurality of pairs of source and destination block addresses are required. In this case, when a data writing operation for a certain block is completed, the next data writing operation for another block must be performed sequentially. For this reason, the judgment is required. If as a result of the judgment, another block to be subjected to the next writing operation is found, the operation proceeds to step S5 shown in FIG. 8. On the other hand, if another block to be subjected the next writing operation is not found, the writing operation is completed.

According to above described embodiment of the present invention, because the verification of the erased states of all flash memory cells 16 included in an erased block in which data is to be stored is performed prior to data writing thereto in response to data writing instruction from the host computer 5, it is not possible to write improper data owing to the existence of a flash memory cell whose state has changed from the erased state to the programmed state. Therefore, the quality of the data writing can be improved.

As another method for improving the quality of the data writing, it is conceivable to check the correctness of data already stored after the data writing operation. According to this method, however, in the case where different data from expected data have been stored in an erased block because the block included some error, the controller is required to request the host computer to send the data to be stored again or to employ a page buffer to store the write data until it is confirmed that the write data are successfully stored in the erased block. This makes the structure of the flash memory system complex. In contrast, the method according to the foregoing embodiment of the present invention can avoid a complex structure of the flash memory system because the method can be performed by generally performed operations of a general flash memory system, such as reading or writing operations.

Moreover, according to above-described embodiment of the present invention, when change of flash memory cell state from the erased state to the programmed state is detected in the erased block during the verification, it is judged whether the block is an acquired-defect block. Therefore, because the block can be used as a normal block if the block is verified to be not an acquired-defect block but a block with a transient error, exclusion of blocks found to have transient error can be avoided to avoid to unnecessary reduction of flash memory device capacity.

Further according to above described embodiment of the present invention, when change of flash memory cell state from the erased state to the programmed state is detected in the erased block during the verification, a new write queue is searched by returning to the step S5 to find new erased block for storing data and the data are stored in the newly found block. Therefore, the test operation by steps S14 to S16 and the data write operation by steps S5 to S13 are performed in parallel. Specifically, when a flash memory cell in the programmed state is detected in the erased block, a test operation starting from step S14 can be performed in parallel with the data writing operation starting from step S5 to store the write data into a new erased block. According to such parallel operation, the writing operation can be performed relatively fast if a flash memory cell in the programmed state is detected in the erased block during step S8.

Further, in the data writing operation according to the foregoing embodiment of the present invention, the flash sequencer block 12 can perform operations in parallel to access of the SRAM work area 8 by the microprocessor 6 to check the content of the address translation table 27. This parallel operation enables the writing operation to be performed faster because the search of the write queue in step S5 can be performed during write sequencer setting in step S4.

Next, a flash memory system according to another preferred embodiment of the present invention will be explained.

Figure 11:
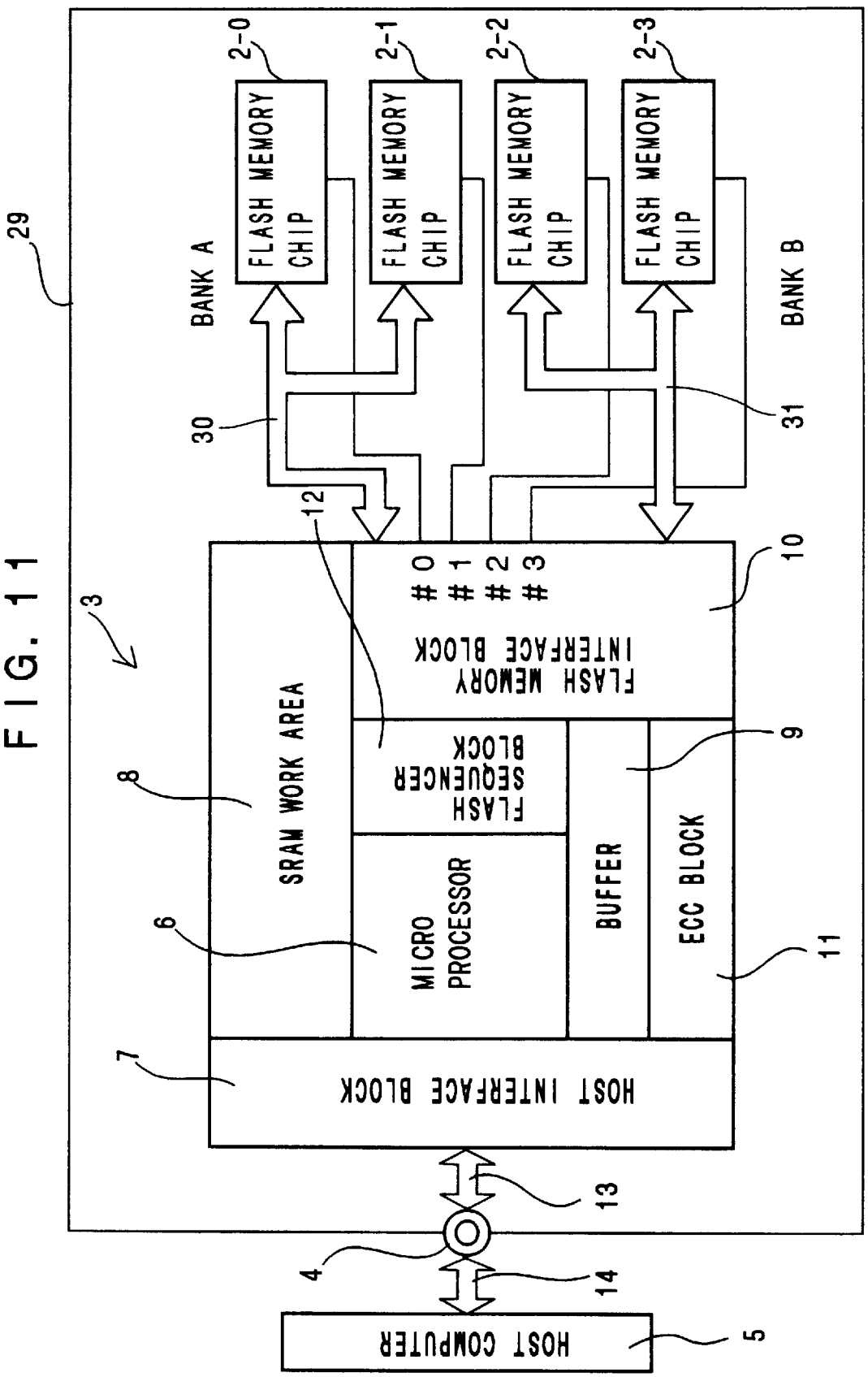
FIG. 11 is a schematic block diagram showing a flash memory system 29 which is another preferred embodiment of the present invention.

FIG. 11 is a schematic block diagram showing a flash memory system 29 which is another preferred embodiment of the present invention.

As shown in FIG. 11, the flash memory system 29 has the same structure as the flash memory system 1 described above except that the flash memory chips 2-0 to 2-3 are divided into two banks, banks A and B, each having an individual bus.

According to flash memory system 29, because the flash memory chips 2-0 to 2-3 are divided into the banks A and B, one of the chip selection signals #0 and #1 and one of the chip selection signals #2 and #3 can be activated together, so that the reading or writing operation to the flash memory chip 2-0 or 2-1 can be performed while the reading or writing operation to the flash memory chip 2-2 or 2-3 is performed. According to flash memory system 29, therefore, the test operation shown in step S14 can be performed in one bank while the data writing operation or the block erasing operation is performed in the other bank.

According to this embodiment, degradation of performance of the data writing operation caused by performing the test operation is substantially avoided.

As described above, according to the present invention, the quality of data writing is improved because verification of the erased states of all flash memory cells included in an erased block in which data is to be stored is performed prior to data writing thereto.

The present invention simplifies vendor formatting performed by manufacturers of products utilizing flash memory chips.

In the case of a block having an initial failure, the manufacturers of the flash memory chips changes the state of a certain memory cell to the programmed state (0). Thus, the state of at least one flash memory cell constituting an initial failure block has already been changed to the programmed state (0) prior to shipment of the flash memory chips from the chip manufacturer, whereas all flash memory cells constituting good blocks are in the erased state (1). Thus, the manufacturer of utilizing flash memory chips product can notice that initial failure blocks are included in the flash memory chips and take measures to prevent data from being stored into such a block.

Manufacturers of products including flash memory chips generally subject flash memory chips to be incorporated in their products to repeated reading and writing tests to detect and eliminate acquired-defect blocks. This process is called vendor formatting. A defective block detected at or after vendor formatting is called becomes an "acquired-defect block".

FIG. 12 is a flow chart showing a vendor format for detecting acquired defects.

In accordance with the vender format, at first, a selected block is block-erased in step S100. Next, it is judged whether or not the status is proper (step S101). If as a result of the judgment it is found that the status is improper, an exclusion operation (step S111) is performed to inhibit use of the defect block, whereafter the operation proceeds to step S110, in which it is judged whether this block is the final block. If the block is concluded to be the final block, the vendor formatting is completed, whereas if the block is not concluded to be the final block, the block address is incremented (step S112). The operation then returns to step S100 to erase the next block.

If the status is concluded to be proper in step S101, then a block reading is performed (step S102), whereafter it is judged whether or not all memory cells constituting the block are in the erased state, i.e., whether or not the values thereof are "all 1" (step S103). If as a result of the judgment, all memory cell are concluded to be in the erased state, the operation proceeds to step S104, whereas if all memory cell are not concluded to be in the erased state, the operation proceeds to step S111 to perform an exclusion operation. The operation then proceeds to step S110.

In step S104, a writing operation is performed for all memory cells constituting the block. Next, it is judged whether or not the status is proper (step S105). If as a result of the judgment it is found that the status is improper, an exclusion operation (step S111) is performed to inhibit use, whereafter the operation proceeds to step S110. If the status is concluded to be proper in step S105, then a block reading is performed (step S106), whereafter it is judged whether or not the states of all memory cells constituting the block are in the programmed state, i.e., whether or not the values thereof are "all 0" (step S107). If as a result of the judgment, all memory cell are concluded to be in the programmed state, the operation proceeds to step S108, whereas if the states of all memory cell are not concluded to be in the erased state, the operation proceeds to step S111 to perform an exclusion operation. The operation then proceeds to step S110.

In step S108, the block is block-erased again. Next, it is judged whether or not the status is proper (step S109). If as a result of the judgment it is found that the status is improper, an exclusion operation (step S111) is performed to inhibit use, whereafter the operation proceeds to step S110. If the status is concluded to be proper in step S109, the operation proceeds to step S110 to judge whether or not the block is the final block. If the block is concluded to be the final block, the vendor formatting is completed, whereas if the block is not concluded to be the final block, the block address is incremented (step S112). The operation then returns to the step S100 to erase the next block.

Acquired defects in all blocks of the flash memory device can be detected by performing the vendor formatting.

According to the vendor format, however, because the erasing and writing operations must be performed for all blocks of the flash memory device, the vendor formatting time increases in proportion to the memory capacity. For example, in the case where vendor formatting is performed for a flash memory card employing a plurality of flash memory chips, the vendor formatting time increases in proportion to the memory capacity of the card. Therefore, vendor formatting for flash memory cards having a large memory capacity takes a very long time. This decreases throughput and increases cost. For example, in the case where vendor formatting is performed for a 128 MB flash memory card employing four 32 MB flash memory chips of NAND type, the vendor formatting time is estimated at more than 60 seconds, which is only the time required for the flash memory chips. The vendor formatting time is expected to increase in the future because the memory capacity of recent flash memory cards is as large as 512 MB or 1 GB, and memory capacity is expected to be come even greater in the future. Further, increasing the memory capacity of flash memory cards makes the algorithm of the vendor format more complex, so that the vendor formatting time is expected to increase.

In case of applying the present invention, however, such vendor formatting is not required because the verification of the state of the erased block in which data is to be stored is performed prior to data writing thereto during actual use. Therefore, the load on the manufacturers of products using flash memory cards decreases to lower the cost of the products.

The present invention can be embodied as a PC card conforming with the standard regulation proposed by the PCMCIA (Personal Computer Memory Card International Association). Further, the present invention can be embodied as a highly miniaturized memory card realized by the development of high-integration technologies for semiconductor devices, such as the Compact Flash™ proposed by the CFA (Compact Flash Association), the SmartMedia™" proposed by the SSFDC Forum, the MMC™ (MultiMedia Card) proposed by the MultiMedia Card Association, the Memory Stick™ proposed by SONY corporation, or the like.

The present invention has thus been shown and described with reference to specific embodiments. However, it should be noted that the present invention is in no way limited to the details of the described arrangements but changes and modifications may be made without departing from the scope of the appended claims.

For example, in the flash memory systems 1 and 29 according to the above described embodiments, the flash memory systems 1 and 29 are embodied as a card. However, the flash memory system according to the present invention is not limited to a card-shape and can be embodied in other shapes such as stick-shaped.

Further, in the flash memory systems 1 and 29 according to the above described embodiments, the flash memory systems 1 and 29 are embodied as a card in which the 4 flash memory chips 2-0 to 2-3 and the controller 3 are integrated. However, the present invention is not limited to the flash memory chips 2-0 to 2-3 and the controller 3 being integrated in the same package, and they can instead in individually packaged. In this case, connectors must be added to the package for the flash memory chips 2-0 to 2-3 and the package for the controller 3 to establish electrical and physical connection therebetween. Therefore, the package for the flash memory chips 2-0 to 2-3 can be removably attached to the package for the controller 3. Moreover, the invention is also not limited to the flash memory chips 2-0 to 2-3 being integrated in the same package but also encompasses the case where they are individually packaged.

Furthermore, in the flash memory systems 1 and 29 according to the above described embodiments, 4 flash memory chips 2-0 to 2-3 are employed in the flash memory systems 1 and 29 controlled by the controller 3. However, the present invention is not limited to the number of the flash memory chips employed in the flash memory system and controlled by the controller being 4. That is, it is possible for the number of the flash memory chips employed in the flash memory system and controlled by the controller to be another number such as 1 or 8.

Further, in the flash memory systems 1 and 29 according to the above described embodiments, the memory capacity of each of the flash memory chips 2-0 to 2-3 is 128 M bytes (1 G bits). However, the memory capacity of each of the flash memory chips employed in the flash memory system according to the present invention is not limited to 128 M bytes (1 G bits) and can be another capacity such as 32 M bytes (256 M bits).

Furthermore, in the flash memory systems 1 and 29 according to the above described embodiments, each page constituting the minimum access unit is composed of 512 bytes. However, the capacity of the page constituting the minimum access unit is not limited to 512 bytes but can be another capacity.

Further, in the flash memory systems 1 and 29 according to the above described embodiments, these 4 flash memory chips 2-0 to 2-3 are treated as a big single memory having 1M pages of address space. However, each flash memory chip 2-0 to 2-3 can be treated as an individual memory.

Furthermore, in the flash memory systems 1 and 29 according to the above described embodiments, each flash memory cell 16 employed in the flash memory chips 2-0 to 2-3 can store 1 bit of data. However, the flash memory cells employed in the flash memory chip can be ones enabled to store 2 or more bits of data by controlling the number of electrons injected into the floating gate electrode 21.

Further, in the flash memory systems 1 and 29 according to the above described embodiments, when a flash memory cell in the programmed state is detected in step S8, the operation returns to step S5 to search a new write queue and the writing operation is performed for a new erased block, regardless of whether the block including the memory cell in the programmed state is judged a proper block or an acquired-defect block by the test operation (step S14) performed thereafter. However, the present invention is not limited to such an operation and the writing operation can be retried for the same block in which the defect was detected when the block is concluded to be a proper block by the test operation (step S14). In such operation, however, the operation is suspended until the test operation (step S14) is completed. Therefore it is preferable to restrict the number of verifying operation retries (step S7) for the same block in order to prevent degradation of performance.

Furthermore, in the flash memory systems 1 and 29 according to the above described embodiments, each block is composed of 32 pages. However, the number of pages composing each block is not limited to 32 and can be another number such as 16 or 64.

Further, in the flash memory systems 1 and 29 according to the above described embodiments, the write queue 28 is composed of 8 queues. However, the number of queues is not limited to 8 and can be another number such as 4 or 16.

Furthermore, in the flash memory systems 1 and 29 according to the above described embodiments, an erase flag is provided at the redundant area 26 of the top page (page 0) of each block to enable to detection of whether or not each block is an erased block. However, it is not essential to employ the erase flag in the redundant area 26. For example, it is possible to assign "all 1 (1023)" to erased blocks as the corresponding logical block address to indicate the block is an erased block.

Further, in the flash memory system 1 according to the above described embodiment, the chip selection signal corresponding to the flash memory chip to be selected is activated until the writing or erasing operations is completed. However, the chip selection signal corresponding to the flash memory chip to be selected can be inactivated during a flash programming period, which is a period for actual programming to flash memory cells, and a flash erasing period, which is a period for actual erasing to flash memory cells, to enable activation of another chip selection signal. By this, a parallel operation can be performed to improve performance to the level of the flash memory system 29, in spite of the fact that the flash memory system 1 has a single bank structure.

Furthermore, in the flash memory systems 1 and 29 according to the above described embodiments, when a flash memory cell in the programmed state is found in step S8, the operation returns to step S5 to search new write queue in order to retry the writing operation. However, the number of the retries can be restricted to a certain number such as 1.

Further, in this specification and the appended claims, the respective means need not necessarily be physical means and arrangements whereby the functions of the respective means are accomplished by software fall within the scope of the present invention. In addition, the function of a single means may be accomplished by two or more physical means and the functions of two or more means may be accomplished by a single physical means.

As explained in the foregoing, the present invention provides a memory controller and a flash memory system that can write data to a flash memory device accurately and a method for writing data to a flash memory device accurately.

What is claimed is:

1. A memory controller for accessing a flash memory device, comprising:
    a write queue in which erased blocks in said flash memory device are registered; selecting means for selecting at least one erased block from the erased blocks registered in the write queue in response to a data storing request from a host computer;
    verify means for verifying a state of said erased block found by said search means;
    and store means for storing data into said erased block which has been verified by said verify means.

2. The memory controller as claimed in claim 1, wherein said verify means verifies whether or not all flash memory cells constituting said erased block found by said search means are in an erased state.

3. A memory controller for accessing a flash memory device, comprising:
    search means for finding an erased block in said flash memory device in response to a data storing request from a host computer;
    verify means for verifying a state of said erased block found by the search means; store means for storing data into said erased block which has been verified by said verify means, wherein said verify means verifies whether or not all flash memory cells constituting said erased block found by said search means are in an erased state;
    test means, responsive to detection by said verify means of a flash memory cell in a different state from said erased state, for testing whether or not said erased block is a defective block with a permanent error.

4. The memory controller as claimed in claim 3, wherein said test means performs writing and first reading operations to store and read first test data to/from all flash memory cells constituting said erased block.

5. The memory controller as claimed in claim 4, wherein said test means further performs erasing and second reading operations to store and read second test data to/from all flash memory cells constituting said erased block.

6. A flash memory system, comprising: at least one flash memory chip divided into a plurality of blocks each of which includes a plurality of flash memory cells and a controller for controlling said flash memory chip, said controller including search means for finding from among said plurality of blocks an erased block in which all flash memory cells are in an erased state, store means for storing data into said erased block found by said search means, and verify means for verifying a state of said erased block found by said search means before said data are stored by said store means.

7. The flash memory system as claimed in claim 6, wherein said verify means verifies whether or not all flash memory cells constituting said erased block found by said search means are in an erased state.

8. The flash memory system as claimed in claim 6, wherein said flash memory chip and said controller are enclosed in the same package.

9. The flash memory system as claimed in claim 8, wherein said package is card-shaped.

10. The flash memory system as claimed in claim 6, wherein said controller further comprises test means, responsive to said verify means finding said erased block to be a defective block, for performing a test operation to test whether or not said defective block includes a permanent error.

11. The flash memory system as claimed in claim 10, wherein said test means inhibits use of said defective block in response to said defective block being found to include a permanent error.

12. The flash memory system as claimed in claim 10, wherein said flash memory system employs a plurality of flash memory chips, and said store means can store data into an erased block belonging to one flash memory chip while said test means performs said test operation on a defective block belonging to another flash memory chip.

13. A method of storing data into a flash memory device divided into a plurality of blocks, comprising the steps of: searching said plurality of blocks to find a block in which all flash memory cells are in an erased state, verifying a state of said block found in said searching step, an storing said data into said block verified by said verifying step.

14. A method for storing data into a flash memory device divided into a plurality of blocks, comprising the steps of:
    searching said plurality of blocks to find a block in which to store data, verifying a state of said block found in said searching step, storing said data into said block verified by said verifying step, and testing, in response to said verifying step finding said block found by said searching step to be unsuitable for storing said data, whether or not said block is a defective block with a permanent error.

15. The method for storing a data into a flash memory device as claimed in claim 14, wherein said searching step searches another block for storing said data among said plurality of blocks responsive to said verifying step finding said block found by said searching step to be unsuitable for storing said data for finding.

16. The method for storing a data into a flash memory device as claimed in claim 15, wherein said data are stored into said another block regardless of whether or not said block is found to be a defective block with a permanent error in said testing step.

17. The method for storing a data into a flash memory device as claimed in claim 15, wherein said data are stored into said block if said block is not found to be a defective block with a permanent error in said testing step.

18. The method for storing a data into a flash memory device as claimed in claim 14, wherein said testing step includes writing and first reading sub-steps for storing and reading first test data to/from all flash memory cells constituting said block.

19. The method for storing a data into a flash memory device as claimed in claim 18, wherein said testing step further includes erasing and second reading sub-steps for storing and reading second test data to/from all flash memory cells constituting said erased block.

20. The method for storing a data into a flash memory device as claimed in claim 14, wherein storage of data in said block is inhibited if said block is found to be a defective block with a permanent error in said testing step.

21. A memory controller for accessing a flash memory device, comprising: selecting means for selecting a destination block from a plurality of erased blocks in the flash memory device in response to a data-storing request from a host computer, verify means for verifying a state of the destination block, store means for storing data provided from the host computer in connection with the data-storing request into the destination block, transferring means for transferring data stored in a source block to the destination block, and erasing means for block-erasing the source block.

22. The memory controller of claim 21, further comprising a write queue in which the block-erased blocks are registered.

23. The memory controller of claim 21, wherein the verify means verifies whether all of the flash memory cells in the destination block are in an erased state, and the memory controller further comprising test means, responsive to detection by the verify means of a flash memory cell in a different state from the erased state, for testing whether the destination block is a defective block with a permanent error.

24. The memory controller of claim 23, wherein the test means performs writing and first reading operations to store data to all of the flash memory cells in the destination block and to read first test data from all of the flash memory cells in the destination block.

25. The memory controller of claim 24, wherein the test means further performs erasing and second reading operations to store second test data to all of the flash memory cells in the destination block and to read second test data from all of the flash memory cells in the destination block.

* * * * *